US008072005B2

(12) United States Patent
Dehon et al.

(10) Patent No.: US 8,072,005 B2
(45) Date of Patent: Dec. 6, 2011

(54) APPARATUS, METHOD AND COMPUTER PROGRAM PRODUCT PROVIDING RADIAL ADDRESSING OF NANOWIRES

(75) Inventors: Andre Dehon, Philadelphia, PA (US); Charles M. Lieber, Lexington, MA (US); John E. Savage, Providence, RI (US); Eric Rachlin, Providence, RI (US)

(73) Assignee: Brown University Research Foundation, Providence, RI (US)

( * ) Notice: Subject to any disclaimer, the term of this patent is extended or adjusted under 35 U.S.C. 154(b) by 480 days.

(21) Appl. No.: 11/883,679

(22) PCT Filed: Feb. 2, 2006

(86) PCT No.: PCT/US2006/003840
§ 371 (c)(1),
(2), (4) Date: Jun. 10, 2008

(87) PCT Pub. No.: WO2006/084128
PCT Pub. Date: Aug. 10, 2006

(65) Prior Publication Data
US 2008/0254291 A1    Oct. 16, 2008

(51) Int. Cl.
*H01L 27/10* (2006.01)
(52) U.S. Cl. .................. 257/208; 257/E27.07; 438/128
(58) Field of Classification Search .................. 257/208, 257/E27.07; 438/128
See application file for complete search history.

(56) References Cited

U.S. PATENT DOCUMENTS

| 6,128,214 | A | 10/2000 | Kuekes et al. ................. 365/151 |
| 6,256,767 | B1 | 7/2001 | Kuekes et al. .................... 716/9 |
| 6,359,288 | B1 | 3/2002 | Ying et al. ...................... 257/14 |
| 6,900,479 | B2 | 5/2005 | DeHon et al. ................. 257/202 |
| 6,963,077 | B2 | 11/2005 | DeHon et al. ...................... 257/9 |
| 2003/0089899 | A1 | 5/2003 | Lieber et al. ....................... 257/9 |
| 2004/0112964 | A1* | 6/2004 | Empedocles et al. .......... 235/491 |
| 2006/0008942 | A1* | 1/2006 | Romano et al. ................. 438/99 |
| 2006/0019472 | A1 | 1/2006 | Pan et al. ....................... 438/486 |
| 2006/0081886 | A1* | 4/2006 | Mostarshed et al. .......... 257/213 |

OTHER PUBLICATIONS

Charles P. Collier et al., "A [2]Catenane-Based Solid State Electronically Reconfigurable Switch", Science, 290:1172-1175, Aug. 18, 2000.

Thomas Rueckes et al., "Carbon Nanotube-Based Nonvolatile Random Access Memory for Molecular Computing", Science, 289:94-97, Jul. 7, 2000.

C. P. Collier et al., "Electronically Configurable Molecular-Based Logic Gates", Science, 285:391-394, Jul. 16, 1999.

Zhaohui Zhong et al., "Nanowire Crossbar Arrays as Address Decoders for Integrated Nanosystems", Science, 302:1377-1379, Nov. 21, 2003.

(Continued)

*Primary Examiner* — Steven Fulk
(74) *Attorney, Agent, or Firm* — Harrington & Smith

(57) ABSTRACT

Disclosed is a method to construct a device that includes a plurality of nanowires (NWs) each having a core and at least one shell. The method includes providing a plurality of radially encoded NWs where each shell contains one of a plurality of different shell materials; and differentiating individual ones of the NWs from one another by selectively removing or not removing shell material within areas to be electrically coupled to individual ones of a plurality of mesowires (MWs). Also disclosed is a nanowire array that contains radially encoded NWs, and a computer program product useful in forming a nanowire array.

62 Claims, 12 Drawing Sheets

OTHER PUBLICATIONS

Yu Huang et al., "Directed Assembly of One-Dimensional Nanostructures Into Functional Networks", Science, 291:630-633, Jan. 26, 2001.

Nicholas A. Melosh et al., "Ultrahigh-Density Nanowire Lattices and Circuits", Science 300: 112-115, Apr. 4, 2003.

Alfredo M. Morales et al., "A Laser Ablation Method for the Synthesis of Crystalline Semiconductor Nanowires", Science 279:208-211, Jan. 9, 1998.

Andre Dehon, "Array-Based Architecture for FET-Based, Nanoscale Electronics", IEEE Transactions on Nanotechnology, vol. 2(1):23-32, Mar. 2003.

Andre Dehon, "Stochastic Assembly of Sublithographic Nanoscale Interfaces", IEEE Transactions on Nanotechnology, vol. 2 (3): 165-174, Sep. 2003.

Young Chen et al., "Nanoscale molecular-switch crossbar circuits", Institute of Physics Publishing, Nanotechnology, 14:462-468, 2003.

Yi Cui et al., "Diameter-controlled synthesis of single-crystal silicon nanowires", Applied Physics Letters, vol. 78(15):2214-2216, Apr. 9, 2001.

Andre Dehon et al., "Nonphotolithographic Nanoscale Memory Density Prospects", IEEE Transactions on Nanotechnology, vol. 4 (2):215-228, Mar. 2005.

Cees Dekker, "Carbon Nanotubes As Molecular Quantum Wires", Physics Today, pp. 22-28, May 1999.

Xiangfeng Duan et al., "Nonvolatile Memory and Programmable Logic from Molecule-Gated Nanowires", Nano Letters, vol. 2 (5):487-490, 2002.

Michael D. Austin et al., "Fabrication of 5nm linewidth and 14 nm pitch features by nanoimprint lithography", vol. 8(26): 5299-5301, Jun. 28, 2004.

Benjamin Gojman et al., "Evaluation of Design Strategies for Stochastically Assembled Nanoarray Memories", ACM Journal on Emerging Technologies in Computing Systems, vol. 1(2):73-108, Jul. 2005.

Dongmok Whang et al., "Nanolithography Using Hierarchically Assembled Nanowire Masks", Nano Letters, vol. 3(7):951-954, 2003.

James R. Heath et al., "Molecular Electronics", Physics Today, vol. 56(5):43-49, May 2003.

Mark S. Gudiksen et al., "Growth of nanowire superlattice structures for nanoscale photonics and electronics", Nature, vol. 415(7):617-620, Feb. 7, 2002.

Benjamin Gojman et al., "Decoding of Stochastically Assembled Nanoarrays", In Procs 2004 Int. Symp. On VLSL, Lafayette, La, Feb. 19-20, 2004.

Eric Rachlin et al., "Analysis of a Mask-Based Nanowire Decoder", In Procs 2005 Int. Symp. On VLSI, Tampa, FL, May 11-12, 2005.

E. Johnston-Halperin et al., "Fabrication of Conducting Si Nanowire Arrays", J. Applied Physics Letters, vol. 96(10): 5921-5923, 2004.

Franklin Kim et al., "Langmuir-Blodgett Nanorod Assembly", Journal of the American Chemical society, vol. 123(18): 4360-4361,2001.

Yiying Wu et al., "Block-by-Block Growth of Single-Crystalline Si/SiGe Superlattice Nanowires", Nano Letters, 2(2):83-86, Jan. 19, 2002.

M. T. Bjork et al., "One-dimensional Steeplechase for Electrons Realized", Nano Letters, 2(2):87-89, Jan. 19, 2002.

* cited by examiner

| ETCHABLE OUTER NW SHELLS | ETCHANT | | | |
|---|---|---|---|---|
| | $FeCl_3$ | $NaOH$ | $C_4H_4KNaO_6 + HCl + H_2O_2 + H_2O$ | $C_6H_8O_7 + H_2O_2$ |
| Cu | WILL ETCH | WILL NOT ETCH | WILL NOT ETCH | WILL NOT ETCH |
| $Al_2O_3$ | WILL NOT ETCH | WILL ETCH | WILL NOT ETCH | WILL NOT ETCH |
| GaSb | WILL NOT ETCH | WILL NOT ETCH | 1:51 WITH REGARD TO InAs | 1:100 WITH REGARD TO InAs |
| InAs | WILL NOT ETCH | WILL NOT ETCH | 15:1 WITH REGARD TO GaSb | 100:1 WITH REGARD TO GaSb |

| SHELL | $W_r^1$ | $W_g^1$ | $W_b^2$ | $W_y^2$ | $W_r^3$ | $W_g^3$ |
|---|---|---|---|---|---|---|
| 1 | r |   | r | r | r | r |
| 2 | b / y | b / y | g | y | g / y | b / y |
| 3 | g | r / g | r / g | r / g | g | g |

FIG. 14

| MIN. #CODES $C_R$ | #SHELLS $n$ | RADIAL DISTRIBUTION | TYPE OF DECODER | # MWs $\lambda_n$ | #SHELL TYPES | NW DIAMETER |
|---|---|---|---|---|---|---|
| 12 | 2 | (4,3) | LinearLog | 7 | 7 | 13nm |
| 16 | 2 | (4,4) | FullyLog | 8 | 8 | 13nm |
| 18 | 3 | (3,3,2) | LinearLog | 8 | 6 | 17nm |
| 24 | 3 | (4,3,2) | LinearLog | 9 | 7 | 17nm |
| 27 | 3 | (3,3,3) | LinearLog | 9 | 6 | 17nm |

| $C_A$ | $\lambda_A$ | RADIAL DISTR. | $C_R$ | n | #SHELL TYPES | $\lambda_R$ | # MWs $\lambda_2$ | # CODES $C_A C_R$ | NW DIAMETER |
|---|---|---|---|---|---|---|---|---|---|
| 16 | 8 | (2) | 2 | 1 | 2 | 2 | 16 | 32 | 9nm |
| 8 | 6 | (3) | 3 | 1 | 3 | 3 | 12 | 24 | 9nm |
|   |   | (2) | 2 | 1 | 2 | 2 | 12 | 16 | 9nm |
| 4 | 4 | (3.2) | 6 | 2 | 5 | 5 | 16 | 24 | 13nm |
|   |   | (2.2) | 4 | 2 | 4 | 4 | 12 | 16 | 13nm |
|   |   | (3) | 3 | 1 | 3 | 3 | 12 | 12 | 9nm |
| 2 | 2 | (4.3) | 12 | 2 | 7 | 7 | 16 | 24 | 13nm |
|   |   | (4.2) | 8 | 2 | 6 | 6 | 14 | 16 | 13nm |
|   |   | (3.2) | 6 | 2 | 5 | 5 | 12 | 12 | 13nm |

FIG.16

| $P_{control}$ | CODING STYLE | CODE SIZE | NO. SHELLS | ACTUAL DIAMETER | NW YIELD WITH PROB. .99 | EFFECTIVE PITCH |
|---|---|---|---|---|---|---|
| 1.00 | RADIAL | 12 | 2 | 13 | 672 | 19.3 |
|   |   | 20 | 2 | 13 | 778 | 16.7 |
|   |   | 24 | 3 | 17 | 807 | 21.1 |
|   |   | 80 | 3 | 17 | 928 | 18.3 |
| 0.91 | AXIAL | 12 | 1 | 9 | 628 | 14.3 |
|   |   | 20 | 1 | 9 | 716 | 12.6 |
|   |   | 24 | 1 | 9 | 741 | 12.1 |
|   |   | 80 | 1 | 9 | 839 | 10.7 |
| 0.80 | AXIAL | 12 | 1 | 9 | 575 | 15.7 |
|   |   | 20 | 1 | 9 | 647 | 13.9 |
|   |   | 24 | 1 | 9 | 667 | 13.5 |
|   |   | 80 | 1 | 9 | 743 | 12.1 |
| 0.60 | AXIAL | 12 | 1 | 9 | 451 | 20.0 |
|   |   | 20 | 1 | 9 | 492 | 18.3 |
|   |   | 24 | 1 | 9 | 502 | 17.9 |
|   |   | 80 | 1 | 9 | 544 | 16.5 |

FIG.17

APPARATUS, METHOD AND COMPUTER PROGRAM PRODUCT PROVIDING RADIAL ADDRESSING OF NANOWIRES

STATEMENT OF GOVERNMENT RIGHTS

This invention was made with government support under grant/contract number CCF-0403674 awarded by the National Science Foundation. The government has certain rights in this invention.

TECHNICAL FIELD

The exemplary and non-limiting embodiments of this invention relate generally to nanotechnology and, more specifically, relate to nanowires (NWs) and to structures and devices that employ nanowires, such as crossbar switches used in, for example, memory elements and programmable logic arrays (PLAs).

BACKGROUND

The various publications that are cited below are incorporated by reference herein.

Methods have been developed for growing NWs and carbon nanotubes (NTs) whose diameters are on the order of a few nanometers (a few molecular diameters). Reference in this regard may be had to: Cees Dekker, Carbon nanotubes as molecular quantum wires, Physics Today, pages 22-28, May 1999; Y. Cui, L. Lauhon, M. Gudiksen, J. Wang, and C. M. Lieber, Diameter-controlled synthesis of single crystal silicon nanowires, Applied Physics Letters, 78(15):2214-2216, 2001; A. M. Morales and C. M. Lieber, A laser ablation method for synthesis of crystalline semiconductor nanowires, Science, 279:208-211, 1998; Nicholas A. Melosh, Akram Boukai, Frederic Diana, Brian Gerardot, Antonio Badolato, Pierre M. Petroff, and James R. Heath, Ultrahigh-density nanowire lattices and circuits, Science, 300:112-115, Apr. 4, 2003; and B. Johnston-Halperin, R. Beckman, Y. Luo, N. Melosh, J. Green, and J. R. Heath, Fabrication of conducting silicon nanowire arrays, J. Applied Physics Letters, 96(10): 5921-5923, 2004. Methods have also been developed to assemble NWs into nanoarrays, crossbars containing two orthogonal sets of parallel wires on either side of a molecular layer. Reference in this regard can be made to: Nicholas A. Melosh, Akram Boukai, Frederic Diana, Brian Gerardot, Antonio Badolato, Pierre M. Petroff, and James R. Heath, Ultrahigh-density nanowire lattices and circuits, Science, 300:112-115, Apr. 4, 2003; P. J. Kuekes, R. S. Williams, and J. R. Heath, Molecular wire crossbar memory, U.S. Pat. No. 6,128,214, Oct. 3, 2000; Yong Chen, Gun-Young Jung, Doublas A. A. Ohlberg, Xuema Li, Duncan R. Stewart, Jon O. Jeppeson, Kent A. Nielson, J. Fraser Stoddart, and R. Stanley Williams, Nanoscale molecular-switch crossbar circuits, Nanotechnology, 14:462-468, 2003; Dongmok Whang, Song Jin, and Charles M. Lieber, Nanolithography using hierarchically assembled nanowire masks, Nano Letters, 3(7):951-954, 2003; Zhaohui Zhong, Deli Wang, Yi Cui, Marc W. Bockrath, and Charles M. Lieber, Nanowire crossbar arrays as address decoders for integrated nanosystems, Science, 302:1377-1379, 2003; Y. Huang, X. Duan, Q. Wei, and C. M. Lieber, Directed assembly of one-dimensional nanostructures into functional networks, Science, 291:630-633, 2001; and Franklin Kim, Serena Kwan, Jennifer Akana, and Peidong Yang, Langmuir-Blodgett nanorod assembly, Journal of the American Chemical Society, 123(18):4360-4361, 2001. The molecules in the molecular layer are chosen so that under the application of large positive and negative electric fields they change their conductivity. Reference in this regard can be had to: Charles P. Collier, Gunter Mattersteig, Eric W. Wong, Yi Luo, Kristen Beverly, José Sampaio, Francisco Raymo, J. Fraser Stoddart, and James R. Heath, A [2]catenane-based solid state electronically reconfigurable switch, Science, 290:1172-1175, 2000; C. P. Collier, B. W. Wong, M. Belohradsk, F. M. Raymo, J. F. Stoddart, P. J. Kuekes, R. S. Williams, and J. R. Heath, Electronically configurable molecular-based logic gates, Science, 285:391-394, 1999; Thomas Rueckes, Kyoungha Kim, Ernesto Joselevich, Greg Y. Tseng, Chin-Li Cheung, and C. M. Lieber, Carbon nanotube-based nonvolatile random access memory for molecular computing, Science, 289:94-97, 2000; and X. Duan, Y. Huang, and C. M. Lieber, Nonvolatile memory and programmable logic from molecule-gated nanowires, Nano Letters, 2(5):487-490, 2002. The state of a switch at a crosspoint (defined by a pair of orthogonal NWs) can be sensed without changing its state by application of a smaller electric field. Such "nanocrossbars" have the potential to serve as very high density memories and programmed logic arrays (PLAs). Reference in this regard may be made to: André DeHon, Array-based architecture for FET-based, nanoscale electronics, IEEE Transactions on Nanotechnology, 2(1):23-32, March 2003; André DeHon, Patrick Lincoln, and John B. Savage, Stochastic assembly of sublithographic nanoscale interfaces, IEEE Transactions on Nanotechnology, 2(3):165-174, 2003; Benjamin Gojman, Eric Rachlin, and John B Savage, Decoding of stochastically assembled nanoarrays, In Procs 2004 Int. Symp. on VLSL Lafayette, La., Feb. 19-20, 2004; Eric Rachlin, John B Savage, and Benjamin Gojman, Analysis of a mask-based nanowire decoder, In Procs 2005 Int. Symp. on VLSI, Tampa, Fla., May 11-12, 2005; and André DeHon, Seth Copen Goldstein, Philip Kuekes, and Patrick Lincoln, Nonphotolithographic nanoscale memory density prospects, IEEE Transactions on Nanotechnology, 4(2):215-228, 2005. A prototype 8×8 crossbar with a density of 6.4 Gbits/cm$^2$ has been announced that is based on these technologies (see Yong Chen et al., Nanoscale molecular-switch crossbar circuits, Nanotechnology, 14:462-468, 2003) and a memory with storage capacity of 10 Gbits based on crossbars of NTs is promised (see http://www.nantero.com). It has been estimated that a memory density exceeding $10^{11}$ bits/cm$^2$ is possible (André DeHon et. al., Nonphotolithographic nanoscale memory density prospects, IEEE Transactions on Nanotechnology, 4(2): 215-228, 2005).

To read and store data in nanoarrays requires that individual NWs be addressable. That is, it must be possible to select one NW from each orthogonal set of NWs and apply a voltage to it or pass a current through it. To control NWs from the lithographic level requires that mesoscale wires (MWs) be used to address NWs. However, if each NW is connected to a single MW, the close packing possible with NWs is lost. Thus, schemes are needed that use multiple MWs to control individual NWs.

Several such schemes, referred to as decoders, have been proposed. All assume that MWs are placed at right angles to NWs, as suggested in FIG. 1, where the MWs are labeled $A_{r,i}$ and $A_{c,j}$.

As is explained in further detail below, three types of decoders have been proposed to control MWs. Briefly, the first decoder assumes that gold particles are placed randomly between undifferentiated NWs and MWs. The second assumes that high-K dielectric regions are placed between undifferentiated lightly doped NWs (they can be controlled by electric fields) and MWs. The third assumes that NWs are differentiated during their manufacture by growing lightly doped regions into NWs (modulation doping) that have a length equal to the width of the MWs.

These three methods of addressing NWs that have been developed may be referred to as the randomized contact decoder, the mask-based decoder, and the differentiated NW decoder, respectively.

Two types of axial NW doping patterns, the $(h, \lambda_A)$-hot and binary reflected codes are described below. The problems that arise in controlling these NWs due to misalignment between doped and undoped NW regions and MWs are also explored. A question that arises is whether there exist fail-safe doping patterns, namely, those that guarantee that every NW is either "on" or "off", but not in an ambiguous state as a result of misalignment.

Described now in greater detail are the conventional methods proposed for addressing differentiated and undifferentiated NWs with MWs. Each has associated with it a circuit(s), called a decoder(s), that makes one NW conductive ("turns it on") and the rest non-conductive ("turns them off").

The first method of addressing NWs, the randomized contact decoder, assumes that undifferentiated NWs are arranged in parallel. Gold particles are deposited at random between MWs and the NWs with the goal of placing gold particles at about half of the junctions formed by MWs and NWs (see R. S. Williams and P. J. Kuekes, Demultiplexer for a molecular wire crossbar network, U.S. Pat. No. 6,256,767, Jul. 3, 2001). The difficulty of achieving this goal has not been assessed.

Under these assumptions it has been shown that with high probability the randomized contact decoder uses $5 \log_2 N$ MWs to control N NWs. That is, with this many MWs, it is possible to select an arbitrary one of N NWs to be conducting and the rest non-conducting.

The second method uses long, undifferentiated NWs. They can be grown using molecular beam epitaxy (MBE) (the SNAP method, see Nicholas A. Melosh et al., Ultrahigh-density nanowire lattices and circuits, Science, 300:112-115, Apr. 4, 2003) or by nanoimprinting (see Michael D. Austin, Haixiong Ge, Wei Wu, Mingtao Li, Zhaoning Yu, D. Wasserman, S. A. Lyon, and Stephen Y. Chou, Fabrication of 5 nm linewidth and 14 nm pitch features by nanoimprint lithography, Applied Physics Letters, 84(26):5299-5301, Jun. 28, 2004).

FIG. 3 shows a SNAP process to grow NWs by a) forming a superlattice using molecular-beam epitaxy, b) etching away alternating layers in the superlattice, c) depositing metal on the superlattice edges, and d) pressing the metals wires onto an adhesive layer of a chip.

In the SNAP method the superlattice is formed consisting of alternating layers of two materials, such as Aluminum Gallium Arsenide (AlGaAs) and Gallium Arsenide (GaAs), is formed and one type of material, such as AlGaAs, is etched back to create notches. The superlattice is turned and metal deposited on the exposed edges. The superlattice is then pressed onto a chip that contains a thin layer of an adhesive. When removed, long straight NWs are deposited. These NWs have uniform diameter and pitch, unlike the modulation-doped NWs, described below, that are assembled fluidically.

In a nano-imprinting method, a template is grown, perhaps using MBE, and the template is pressed against a soft polymer, thereby creating a contrast pattern in the polymer. Anisotropic etching removes the thin regions, thereby exposing the substrate for doping. The metallic NWs deposited by the SNAP method can also serve the same purpose. If the surface has a thin layer of Si on $SiO_2$ which in turn is on a substrate, the SNAP metallic wires can be used with etching to expose Si NWs (see B. Johnston-Halperin et al., Fabrication of conducting silicon nanowire arrays. J. Applied Physics Letters, 96(10):5921-5923, 2004).

The method proposed to address undifferentiated NWs, referred to as the randomized mask-based decoder (see James R. Heath and Mark A. Ratner, Molecular electronics, Physics Today, 56(5):43-49, 2003), uses lithographically defined rectangular regions of low-K dielectric to shield NWs from the fields associated with MWs. As suggested in FIG. 4, if dielectric regions as small as the pitch of NWs can be produced lithographically, electric fields applied to one of $a_i$ or $\bar{a}_i$ for $1 \leq i \leq \log_2 N$, cause exactly one of N NWs to remain conducting. Here a NW separated from a MW by high-K dielectric acts as a field effect transistor (FET); the application of an electric field of the appropriate strength to the MW immobilizes carriers and drives the conductance of the NW to near zero.

FIG. 4 shows rectangular high-K and low-K dielectric regions that are interposed between vertical MWs and horizontal NWs. The low-K regions shield NWs from the effect of electric fields applied by MWs. When a field is applied to either $a_i$ or $\bar{a}_i$ for $1 \leq i \leq 4$, exactly one of the 16 NWs conducts.

Because lithography puts a lower limit on the size of such regions, many randomly shifted copies of the smallest regions are used instead of the decreasingly smaller regions. The number of MWs needed to control N NWs with the mask-based decoder has been analyzed (see Eric Rachlin et al. in Procs 2005 Int. Symp. on VLSI, Tampa, Fla., May 11-12, 2005). Under very reasonable assumptions it has been shown that, as NW pitch decreases, at least $2 \log_2 N + 46$ MWs will be needed. Although this number is large, the NWs grown with the SNAP process are expected to be much longer and more uniformly spaced than the modulation-doped NWs described next.

The third method, called the differentiated NW decoder, uses NWs that are grown from seed catalysts through a vapor-liquid-solid (VLS) process as depicted in FIG. 5, which shows NWs grown through a vapor-liquid-solid process that are doped as they grow. Reference in this regard can be made to Mark S. Gudiksen, Lincoln J. Lauhon, Jianfang Wang, David C. Smith, and Charles M. Lieber, Growth of nanowire superlattice structures for nanoscale photonics and electronics, Nature, 415:617-620, Feb. 7, 2002; Yiying Wu, Rong Fan, and Peidong Yang, Block-by-block growth of single-crystal Si/SiGe superlattice nanowires, Nano Letters, 2(2):83-86, 2002; and M. T. Björk, B. J. Ohlsson, T. Sass, A. I. Persson, C. Thelander, M. H. Magnusson, K. Deppert, L. R. Wallenberg, and L. Samuelson, One-dimensional steeplechase for electrons realized, Nano Letters, 2(2):87-89, 2002. In an example, silane molecules ($SiH_4$) fall onto gold clusters, precipitating out Si atoms that solidify into crystalline silicon NWs. These NWs can be differentiated by adding dopant molecules to the gaseous mixture as they grow. NWs can be heavily and lightly doped over lengths that are determined by exposure time. This process is referred to as modulation doping when referring to the doping process, and as axial doping when referring to the result.

As stated above, when a MW is placed at right angles to a lightly doped region of a NW and separated from it by high-K dielectric, the MW and NW act as a Field Effect Transistor (FET). The doping levels are chosen so that the same field has no effect on heavily doped regions. One may say that lightly doped regions are controllable, while the heavily doped regions are uncontrollable.

Assume that each NW is given a pattern of controllable and uncontrollable regions, each of the same length. For example, two of four regions could be made controllable, as suggested in FIG. 1, where all six different doping patterns are shown.

Many axially doped NWs with the same doping profile are assembled at the same time and collected in solution. The VLS process is repeated until each of the desired doping profiles is produced. NWs are then assembled on a chip using a fluidic process. NWs with different doping profiles are mixed and floated onto the surface of a liquid where baffles align them in parallel. NWs are deposited by passing the chip up through the liquid. After drying, lithography is used to trim the NWs deposited in this manner. To produce a crossbar this procedure is applied again after turning the chip by 90 degrees. Unfortunately, this process cannot guarantee that NWs will have a uniform separation, nor can it guarantee that the boundaries of doped regions will be aligned with one another, or with any point on the chip.

When NWs are placed on a chip, insulation is used to separate the NWs from MWs that are superimposed on them. This combination of NWs and MWs forms an addressing circuit referred to as an encoded NW decoder.

As with the previously described decoders, this decoder exhibits randomness. In this case the types of NW doping pattern that fall on a chip cannot be predicted in advance. Thus, it is necessary to test the chip to discover which NW doping patterns are present. For applications that require deterministic addresses, such as memories, an auxiliary translation memory is then used to translate fixed external addresses into the particular doping patterns that are deposited on the chip during assembly. An important factor affecting manufacturability is the number of different doping patterns, C, (the size of the code space) that is needed to ensure that all or nearly all of the NWs have different doping patterns.

A discussion is now made of axial doping patterns. Two types of axial codes have been proposed, $(h,\lambda_A)$-hot codes (see again André DeHon, Array-based architecture for FET-based, nanoscale electronics, IEEE Transactions on Nanotechnology, 2(1):23-32, March 2003) and length $\lambda_A$ binary reflected codes ($\lambda_A$-BRCs). Reference in regard to the latter can be made to Benjamin Gojman et al., Decoding of stochastically assembled nanoarrays, In Procs 2004 Int. Symp. on VLSL Lafayette, La., Feb. 19-20, 2004, and to Benjamin Gojman, Eric Rachlin, and John B. Savage, Evaluation of design strategies for stochastically assembled nanoarray memories, J. Emerg. Technol. Comput. Syst., 1(2):73-108, 2005. To describe them one may assume that controllable NW regions are aligned with MWs (see André DeHon, Patrick Lincoln, and John B. Savage, Stochastic assembly of sublithographic nanoscale interfaces, IEEE Transactions on Nanotechnology, 2(3):165-174, 2003).

FIG. 6 shows an example of modulation-doped NWs encoded with a binary reflected code of length eight.

In a $(h,\lambda_A)$-hot code exactly h of $\lambda_A$ regions are controllable. To select one codeword, disabling fields are applied to ($\lambda_A$-h) MWs. The one codeword type whose controllable regions coincide with the MWs to which no field is applied remains conductive.

A $\lambda_A$-BRC has an even number of regions. The doping pattern in the first $\lambda_A/2$ regions is denoted by an arbitrary binary ($\lambda_A/2$)-tuple x (1s (0s) denote controllable (uncontrollable) regions). The doping pattern in the second $\lambda_A/2$ regions is denoted by the Boolean complement of x. A single $\lambda_A$-BRC codeword is selected by applying fields to the MWs that correspond to uncontrollable regions. The one codeword type whose controllable regions coincide with the MWs to which no field is applied remains conductive. The doping patterns for $\lambda_A$-BRC are a subset of the doping patterns of the $(h,\lambda_A)$-hot code.

More specifically, shown in FIG. 6 is an example of a binary reflected code with eight controllable or uncontrollable regions that are aligned with MWs. When the 2nd, 3rd, 5th and 8th MWs are turned on, the 1st, 5th, and 8th NWs, all of which have the same doping pattern, become activated, while all others are turned off.

Discussed now is the addressability of modulation-doped nanoarrays. Using $(h,\lambda_A)$-hot codes, DeHon et al. show that with high probability N modulation-doped NWs can be controlled with $\lceil 2.2 \log_2 N \rceil + 11$ MWs when the design goal is that all NWs doping patterns be different. Using binary reflected codes and the assumption that at least half of the NWs have different doping patterns, Gojman et al. (Decoding of stochastically assembled nanoarrays, In Procs 2004 Int. Symp. on VLSL Lafayette, La., Feb. 19-20, 2004) show that this number can be reduced to $2 \log_2 N + 8$ MWs, although a somewhat better upper bound might be obtained for $(h,\lambda_A)$-hot codes. They also analyze the area needed for the translation memory.

With regard to the misalignment of axial codes, because fluidic assembly methods cannot control the lengthwise displacement of NWs, alignment between MWs and NW controllable regions cannot be guaranteed (see FIG. 7). To compensate for this problem, doping patterns are repeated along the length of NWs. Even with this accommodation, it remains possible that the overlap between NW controllable regions and MWs will be so small that the control of MWs cannot be definitely guaranteed. That is, a MW may be able to reduce the conductivity of a NW but not effectively turn it off. Such a NW may be said to be in an ambiguous state. The alignment problem is compounded by the difficulty of making sharp transitions between controllable and uncontrollable NW regions during the VLS manufacturing process.

To quantity the effect of misalignment, let $W_{overlap}$ be the minimal length overlap needed between the field of a mesoscale wire and a NW to reduce the conductivity to a satisfactory level (see FIG. 8). In FIG. 8 the lightly shaded NW region is assumed to be controllable. When the overlap of this region and the electric field is $W_{overlap}$ or less, the NW cannot be sufficiently controlled.

Let $W_{pitch}$ be the pitch of MWs. Since all shifts of NWs relative to MWs are equally likely, it follows that the probability, $P_{control}$, that a NW is controlled by a MW is $P_{control} = (1-2\ W_{overlap}/W_{pitch})$, a quantity that is used below to compare NW encoding strategies.

Reference may also be made to U.S. Pat. No. 6,963,077 B2, Sublithographic Nanoscale Memory Architecture, André DeHon, Charles M. Lieber, Patrick D. Lincoln and John E. Savage, that discusses radial modulation doping of NWs in, for example, columns 17-19, where the radial doping is etched away in an address window to permit an axial and radially doped NW to be addressed.

SUMMARY

The exemplary embodiments of the invention provide in one aspect thereof a method to construct a device comprised of a plurality of nanowires (NWs) each comprised of a core and at least one shell. The method includes providing a plurality of radially encoded NWs where each shell is comprised of one of a plurality of different shell materials; and differentiating individual ones of the NWs from one another by selectively removing or not removing shell material within areas to be electrically coupled to individual ones of a plurality of mesowires (MWs).

The exemplary embodiments of the invention provide in one further aspect thereof an array comprised of a plurality of NWs each comprised of a core and at least one shell, where the plurality of NWs comprise radially encoded NWs where each shell is comprised of one of a plurality of different shell materials for differentiating individual ones of the radially encoded NWs from one another by having shells that are selectively removed within areas electrically coupled to individual ones of a plurality of MWs.

The exemplary embodiments of the invention provide in one still further aspect thereof a computer program product embodied on a computer readable medium and comprising program instructions the execution of which results in operations of differentiating individual ones of a plurality of radially encoded NWs from one another by determining a sequence of operations to remove or not remove NW shell material within areas to be electrically coupled to individual ones of a plurality of mesowires (MWs), the operations using a plurality of sequentially applied shell material removal agents, where individual ones of the agents are selected based on their ability to strongly remove one type of shell material but not strongly remove other types of shell material.

BRIEF DESCRIPTION OF THE DRAWINGS

In the attached Drawing Figures:

FIG. 11 illustrates four distinct and exemplary NW shell materials and associated suitable etchants.

FIG. 13 shows the materials etched in each shell under each MW for the decoder of three-shell NWs shown in FIG. 12.

FIG. 14 shows parameters of some radial codes with $10 \leq C_R \leq 30$.

FIG. 16 illustrates parameters of hybrid codes that produce 12 to 32 different NW types ($C_A C_R$).

FIG. 17 presents a comparison of axial and radial codes in terms of their effective NW pitch for four different values of C, the code size, for radial codes having s=2 or 3 shells and µ=4 or 5 different types of shell material.

DETAILED DESCRIPTION

To cope with misalignment it would be desirable to provide a control strategy having a NW doping pattern and a MW activation strategy so that a NW is either on or off, and not in an ambiguous state. Such a strategy may be referred to as a fail-safe strategy. It is shown, however, that such strategies do not exist. If a strategy is not fail-safe, one may inquire if it is possible to guarantee that misalignment can never result in some NW being on for all applications of fields to MWs (referred to as "on failures"). If such "on failures" exist they may be disastrous, as it would be impossible to control any NWs in the dimension of the crossbar containing such NWs.

In accordance with exemplary embodiments of this invention there is described a radial encoding of NWs and a method of differentiating and controlling NWs using a small set of meso-scale wires (MWs). Such NWs can be used in, as non-limiting examples, crossbars as memories or programmed logic arrays (PLAs). Methods of controlling (decoding) radially addressed NWs and efficient shell etching algorithms for this purpose are disclosed further in accordance with the exemplary embodiments of this invention. The encoding and decoding methods are shown to be comparable in effective pitch with axially encoded NWs, but do not suffer from misalignment errors that are characteristic of such conventional NWs. Also described and analyzed are hybrid axial/radial NW encodings.

In accordance with exemplary embodiments of this invention a fourth type of decoder is described that is competitive with the three conventional decoders in the number of MWs used to control the NWs, but which has the advantage that it is less sensitive to the random displacements produced by stochastic assembly. The decoder in accordance with exemplary embodiments of this invention operates preferably on core-shell NWs (see Lincoln J. Lauhon, Mark S. Gudiksen, Deli Wang, and Charles M. Lieber, Epitaxial core-shell and core-multishell nanowire heterostructures, Nature, 420:57-61, 2002), that is, lightly-doped NW cores to which shells of different types are added. However, variants of the preferred decoder, referred to as the "linear" and "logarithmic" decoders are described below, which differ in the way shells are used to determine which MWs control which NWs.

Figure 2:
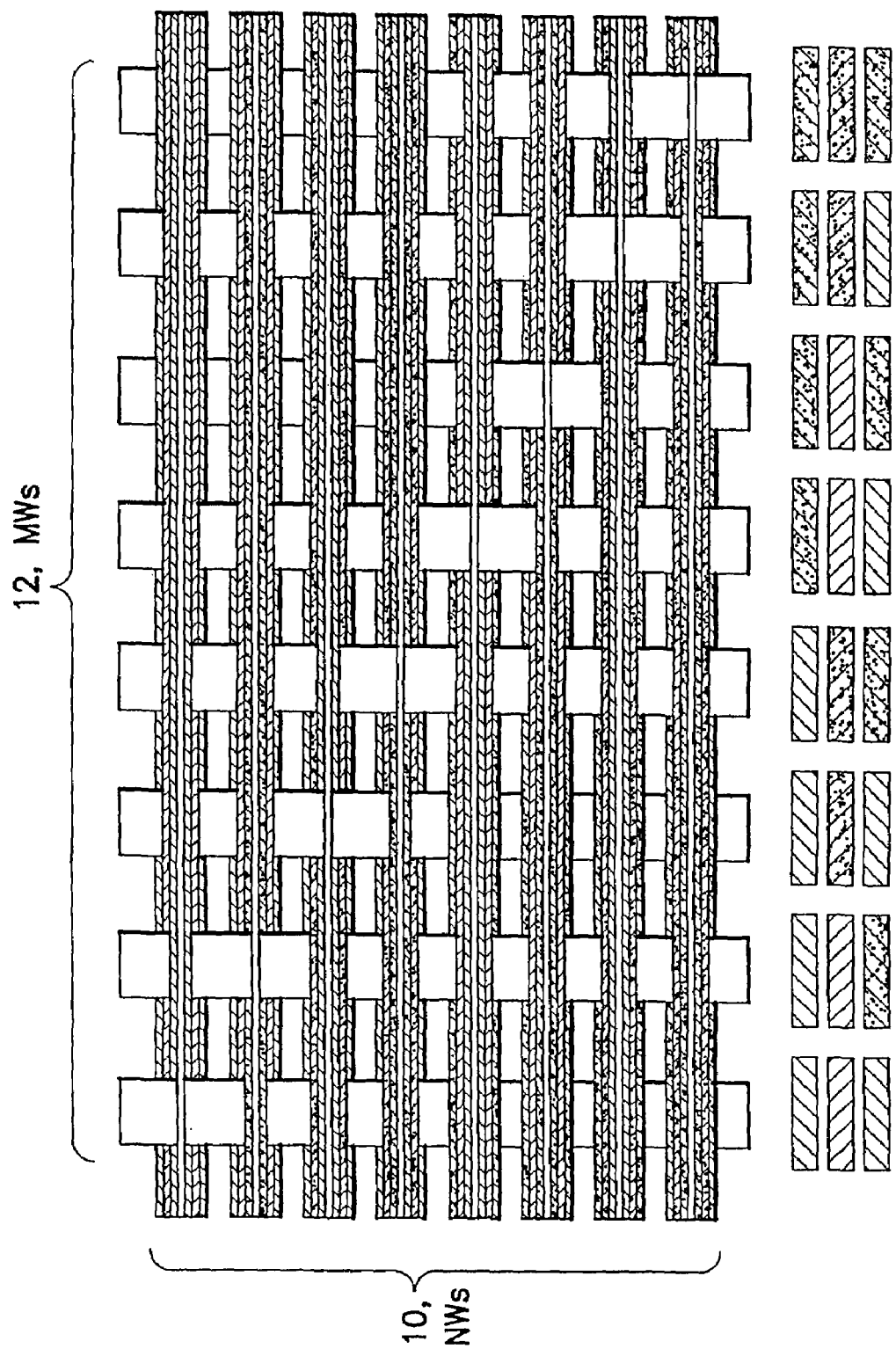
FIG. 2 shows a linear decoding method for an example that employs eight (horizontal) radially encoded NWs.
Figure 3:
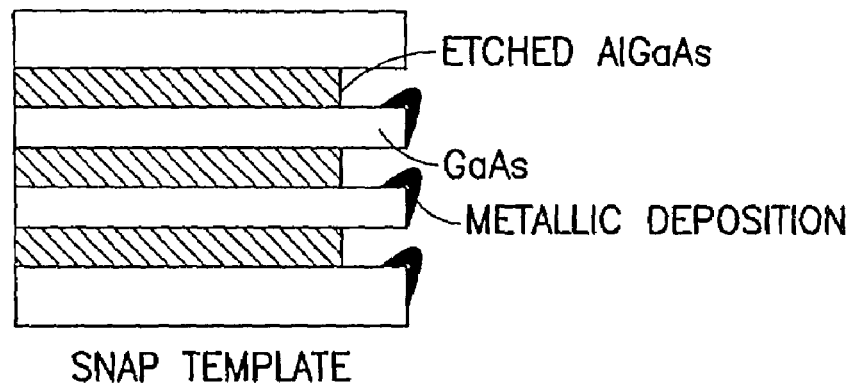
FIG. 3 shows a SNAP process to grow NWs.
Figure 4:
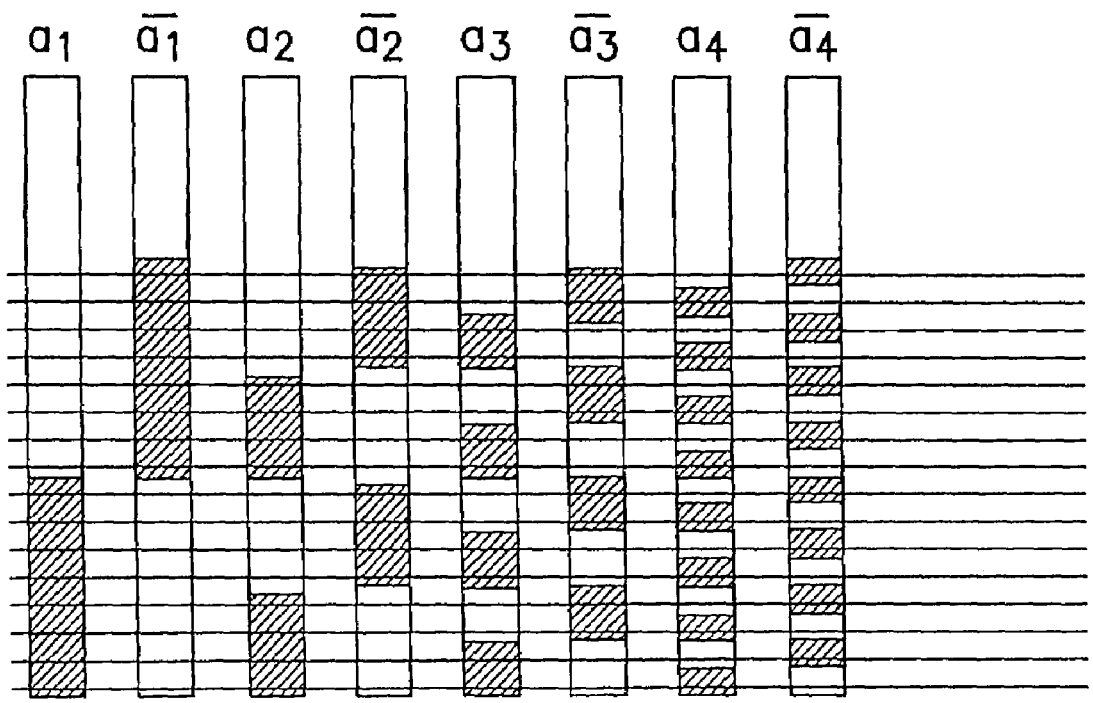
FIG. 4 shows a mask-based decoder for undifferentiated NWs.

To illustrate the decoding method in accordance with exemplary embodiments of this invention, an example of the "linear" decoder is shown in FIG. 2, wherein NWs 10 each have three shells with two types per shell. Also shown are a plurality of mesowires (MWs) 12 disposed orthogonally to the NWs 10.

For example, if NWs 10 can have two types of material in the first shell (e.g., a and b) and three in the second (e.g., c, d, and e), one MW 12 is used for each type of shell encoding ($M_{a,c}$, $M_{b,c}$, $M_{a,d}$, $M_{b,d}$, $M_{a,e}$, $M_{b,e}$, $M_{a,d}$, $M_{b,d}$ in this non-limiting case). In the region reserved for a particular MW 12 (say $M_{b,e}$, the one for shell encoding (b,e)), all shells are removed from NWs 10 with that shell encoding, but one insulating shell remains over all other NWs. When an immobilizing electric field is applied to this MW 12 (say, $M_{b,e}$), those NWs 10 with the assigned shell encoding (say (b,e)) are "turned off," that is, become non-conducting, while the remainder remain "on," that is, conducting. If immobilizing fields are applied to all but one MW 12, just the NWs 10 with the corresponding shell encoding remain on.

In FIG. 2 an insulated lightly-doped core is exposed to the field on a MW 12 if its sequence of shell types is the sequence associated with that MW 12. This example shows for convenience and not by way of limitation four different shell types, where the types used in the inner and outer shells are the same; but the two types on the inner shell are different. The shaded, striped boxes below a MW 12 indicate the order of shell removal, from outer (top) to inner (bottom) shell. If a box contains stripings of one (two) intensity(ies), one (both) shell type(s) is (are) removed. For example, the only NWs 10 whose cores are exposed to the leftmost MW 12 are those for which each shell has a type denoted by light striping.

This novel NW encoding method has several advantages: a) correct operation is more certain than with the first conventional method; b) it may use fewer MWs 12 to control NWs 10 than the second conventional method; and c) registration with MWs 12 of doped NW 10 regions can be guaranteed by construction, unlike the third conventional method.

It can be noted that the use of the novel core-shell encoding scheme may increase the pitch of the NWs 10 since shells add to NW diameter. However, by malting good architectural choices the preferred encoding method is competitive in NW pitch with other proposed NW encoding schemes (see FIGS. 14 and 17).

Because methods of addressing NWs are also needed to program the junctions in PLAs (André DeHon and Michael J. Wilson, Nanowire-based sublithographic programmable logic arrays, In Procs. International Symp. on Field-Programmable Gate Arrays, pages 22-24, Feb. 2004), the addressing methods presented herein also have relevance to these applications.

Described in detail below are radially coded NWs 10, as is a method for etching NW 10 shells to provide control of the NWs 10 with MWs 12. Suitable examples of etchants are also provided. The "linear decoder" is introduced for multi-shell NWs and it is shown that it allows a large number of NW types to be decoded using a small number of shell types and shells. Also described is a "logarithmic decoder" that controls NWs with a smaller number of MWs at the cost of fewer NW types for the same number of shell types and shells. The logarithmic decoder allows for fault tolerance with regard to etching. It is shown that the etching procedures needed to implement each decoder can be executed efficiently in parallel.

Hybrid NW codes and a decoder for them are also described below. Briefly, these are codes for core-shell NWs in which the cores contain an axial code and the shells provide radial encoding. An efficient decoder is disclosed that assumes that each axial code is a binary reflected code. The sensitivity of the BRC hybrid decoder to displacements is also examined.

The effectiveness of the different NW encoding strategies is reviewed, and it is shown that hybrid codes are inferior to axial and radial codes in terms of effective pitch. When axial and radial codes are compared in the same terms, axial codes are seen to have a slight advantage, except when the likelihood of NW misalignment of axial codes is high. Given that axial codes appear to be more difficult to manufacture than radial codes, and that shells are useful for other purposes, radial codes are shown to be a viable alternative to radial codes.

It was noted above that a showing will be made that fail-safe doping patterns are not possible. Before providing a formal proof of this fact, an informal argument is first presented. Consider either $(h,\lambda_A)$-hot code or the $\lambda_A$-BRC doping patterns. A given MW activation pattern causes a set of identically doped NWs to be conducting, while all differently doped NWs become non-conducting. If a conducting NW is shifted by a MW pitch, it becomes non-conducting because it represents another doping pattern. In between these two states the NW must transition from being on to being off, which means that its state must be ambiguous for some shift of less than a MW pitch. This informal argument shows that fail-safe doping patterns do not exist.

To formally characterize the misalignment problem it is useful to introduce certain terminology. First, recall that doping patterns are determined at manufacturing time. Second, it is useful to examine the influence that MWs have on NWs (see FIG. 9). It may be said that a MW is controlling (C) if it is aligned sufficiently well with a controllable region of a NW that the NW can be turned off. The MW is noncontrolling (N) if has the same relationship with the region but the region is uncontrollable. A MW is ambiguous (A) if it is sufficiently close to a controllable region to have some influence on its conductivity but not so much as to turn it off. Given the placement of a NW relative to MWs, one may characterize the influence of $\lambda$ MWs on the NW by a control pattern c, a $\lambda$-tuple over the set $\{C,N,A\}$.

Figure 9:
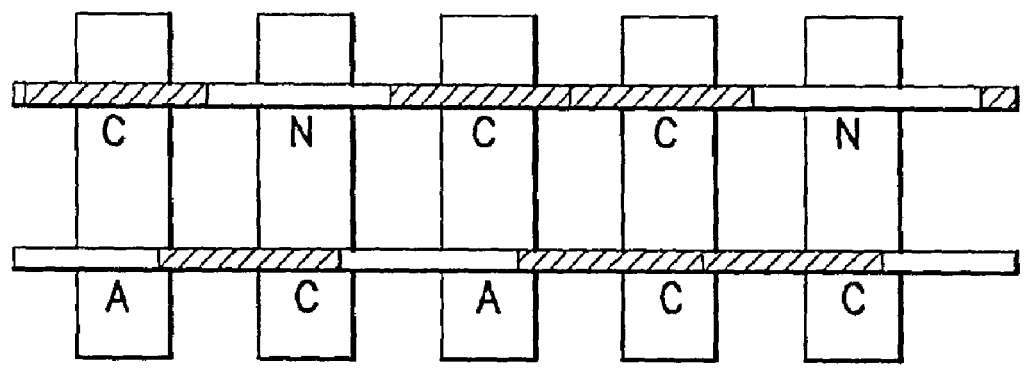
FIG. 9 illustrates the status of MWs as a result of NW misalignment.

It can be readily seen in FIG. 9 that some displacement of each NW with respect to MWs leads to a MW being ambiguous relative to that NW.

An activation pattern a is the application of a field (1) or no field (0) to MWs. It is a $\lambda$-tuple over the set $\{0, 1\}$. Thus, there are $A=2^\lambda$ different activation patterns.

A NW with control pattern c is said to fail relative to an activation pattern a if the conductivity of the NW is not at its maximum or minimum value.

An activation pattern a fails for a set of NWs if no NW is fully conducting when a is applied.

If a control strategy is fail-safe, a predetermined activation strategy can be applied to a set of NWs assembled with a doping strategy without fear that any NW will be left in an ambiguous state.

It is noted that the following proof is presented simply to further elucidate the exemplary embodiments of this invention, and is not required herein to present an enabling disclosure of the exemplary embodiments of this invention.

Lemma: Fail-safe control strategies do not exist

Proof: If a fail-safe control strategy exists, it must be true that for every control pattern there is an activation pattern that either leaves a NW with that control pattern on or off. This follows because one cannot guarantee that another NW exists to mask the ambiguity of the corresponding activation pattern. It is shown that if an activation pattern a causes a NW with control pattern c to conduct, then there is a control pattern c resulting from a shift of that NW that behaves ambiguously with regard to a.

Consider a NW that conducts with activation pattern a. The control pattern c for that NW has N's on MWs that carry a field. A shift of that NW, in one direction or the other, will eventually result in at least one of those N's turning into an A. At the first occurrence of this event, the control pattern will behave ambiguously with respect to a. Previous changes in the control pattern resulting from the shift will be at MWs that are not activated and consequently will have no effect on the NW in question with regard to a.

Having thus established that fail-safe control strategies do not exist, an inquiry can be made as to whether the occurrence of "on" failures can be can be avoided with the doping patterns in accordance with the exemplary embodiments of this invention. It is shown below that they can be avoided for reasonable assumptions on the lengths of the controllable and uncontrollable regions.

Figure 10:
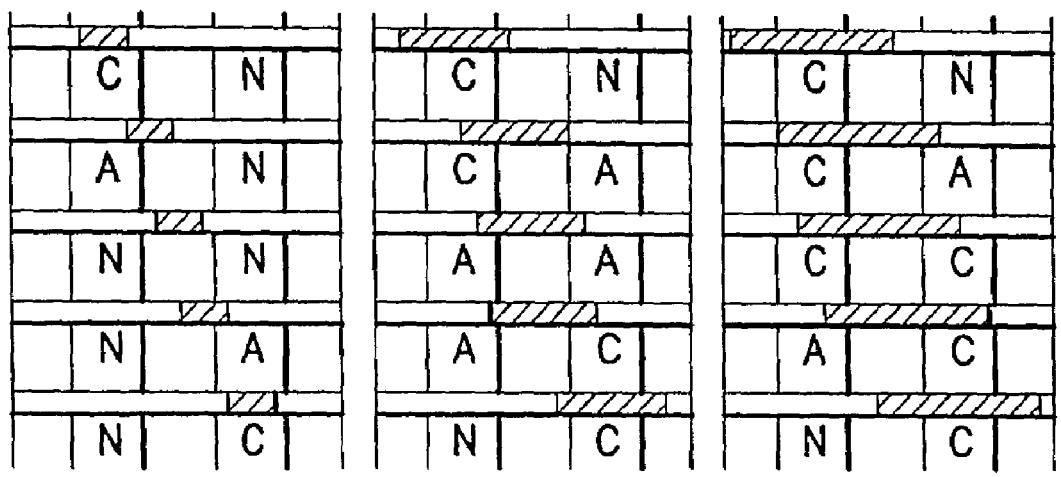
FIG. 10 shows the controllability of a pair of MWs as a function of the length of the lightly doped regions.

FIG. 10 shows the controllability of a pair of MWs as a function of the length of the lightly doped regions. The leftmost case occurs when these regions are very small, and the rightmost case occurs when the lengths are large enough so that at least one MW is always controlling a lightly doped region. The intermediate case is shown in the center.

Figure 8:
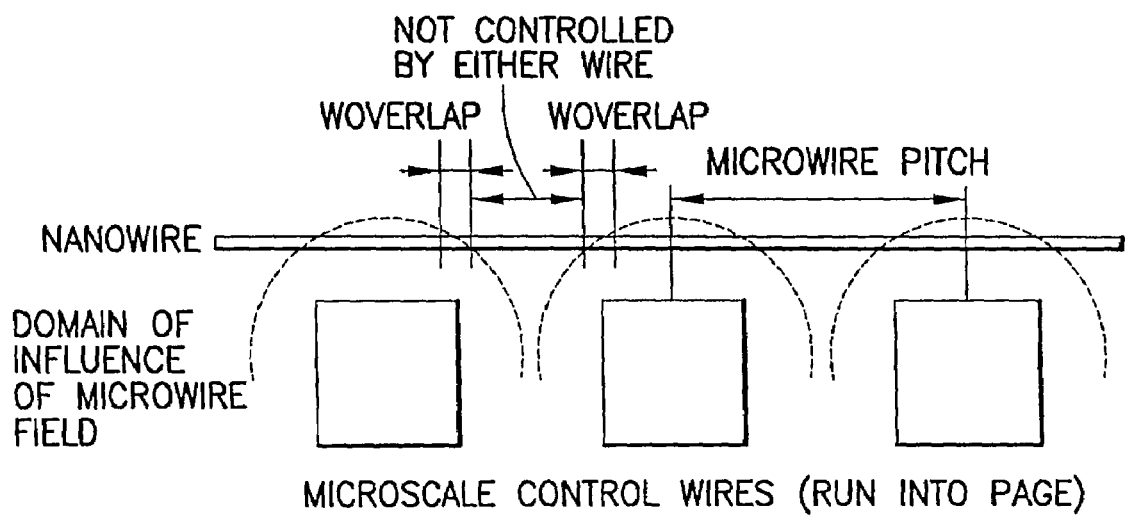
FIG. 8 depicts in a side view a schema for calculating a probability of loss of control of NWs.

Examining now the possible scenarios as a NW shifts to the right as depicted in FIG. 10, assume that the NW has three consecutive regions that are undoped, doped and undoped, moving from left to right, and that the two regions on the right are centered under two MWs. If the doped region is very short, an undoped region is long, and the field strength applied by MWs is low, as the NW shifts to the right the influence of the two MWs begins as CN and changes to AN, NN, NA, NC. With a somewhat higher field strength or longer doped region, the influence of two adjacent MWs begins as CN and changes to CA, AA, AC and NC. With a longer doped region or higher field strength, the change is from CN to CA, AA, AC and NC. Finally, the change is from CN to CA, CC, AC, NC. One may say that doped regions producing the last set of changes are normal because some control is always maintained over a doped region. When the length of a doped region is the length of the region between two MWs (see FIG. 8) plus 2 $W_{overlap}$, the doped regions are normal.

Lemma: The $(h, \lambda_A)$-hot codes and binary reflected codes of length $\lambda_A$ do not exhibit on-type failures when their doped regions are normal.

Proof: For normal doped regions the number of Cs and As in misaligned NWs is more than h for $(h, \lambda_A)$-hot codes and more than $\lambda_A/2$ for $\lambda_A$-BRCs. Since the number of MWs carrying fields is $\lambda_A$-h for the first type of code and $\lambda_A/2$ for the second, misalignment may cause the conductivity of a NW to be ambiguous, but it will not leave a NW fully conducting or on.

In summary, misalignment in $(h, \lambda_A)$-hot and binary reflected codes results in wires that might not turn on when they should, but will always turn off when they should. Consequently, misalignment errors are not catastrophic.

A discussion is now made of codeword activation. As was mentioned above, testing is needed to discover which NW doping patterns have been assembled on a chip. If there is some technique to test a crossbar to determine which activation patterns are ambiguous, these activation patterns can be avoided. This may be possible by forming a voltage divider between the selected NW and an external resistance at $V_{gr}$ (see FIG. 1). One may then set a voltage threshold for acceptance/rejection of the NW selection such that if the voltage is above the threshold, the selected NW resistance is sufficiently low to be accepted, while if the voltage is below the threshold, the NW selection resistance is too high and should be rejected.

In light of the above discussion, one can observe that an activation pattern may turn on many NWs. Thus, one can associate a set of NWs with an activation pattern. There are $A=2^\lambda$ different activation patterns. If an activation pattern activates only NWs that are ambiguous, it can be said that the pattern ambiguously activates a set of NWs. If two different activation patterns activate overlapping sets of NWs, the result is problematic. In this case the data recorded or read with one activation pattern may conflict with data read or recorded by the other pattern. This leads to the following definition.

Definition: A code is a set of activation patterns with the property that no activation pattern ambiguously activates a set of NWs, and the sets of NWs that are activated are disjoint.

A discussion is now made of radially coded nanowires. Core-shell NWs are assembled by adding shells to NWs with lightly doped cores (see Lauhon et al., Epitaxial core-shell and core-multishell nanowire heterostructures. Nature, 420: 57-61, 2002). The sequence of shell materials grown around a NW core is referred to herein as its radial encoding. In accordance with exemplary embodiments of this invention, radial encodings are employed to differentiate and control NWs.

Figure 5:
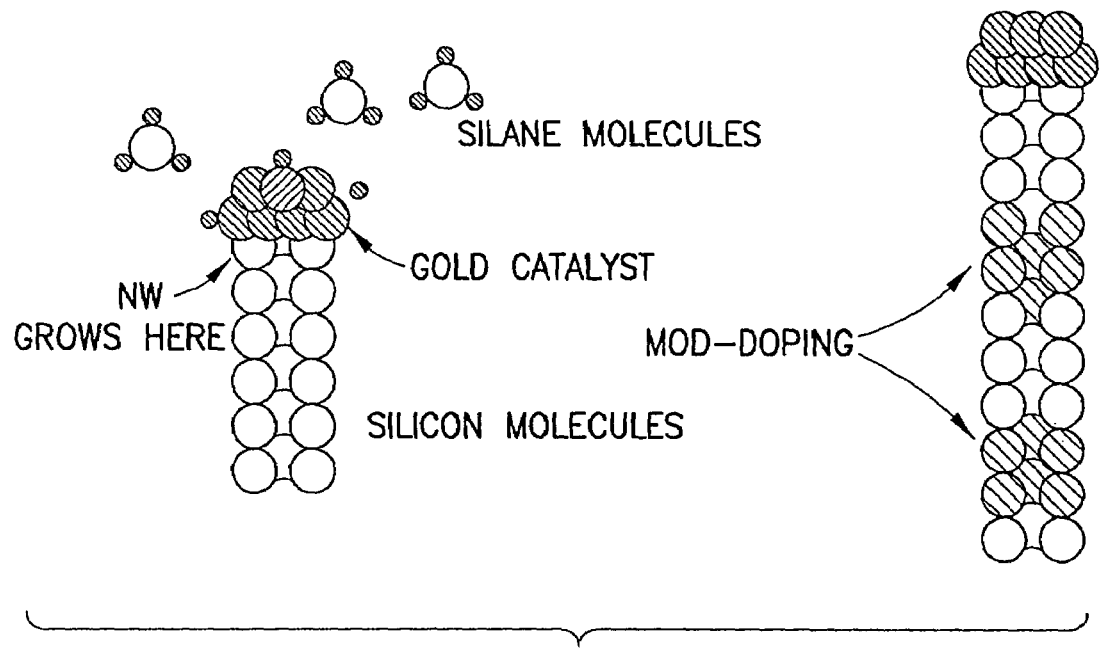
FIG. 5 illustrates the growth of NWs.
Figure 6:
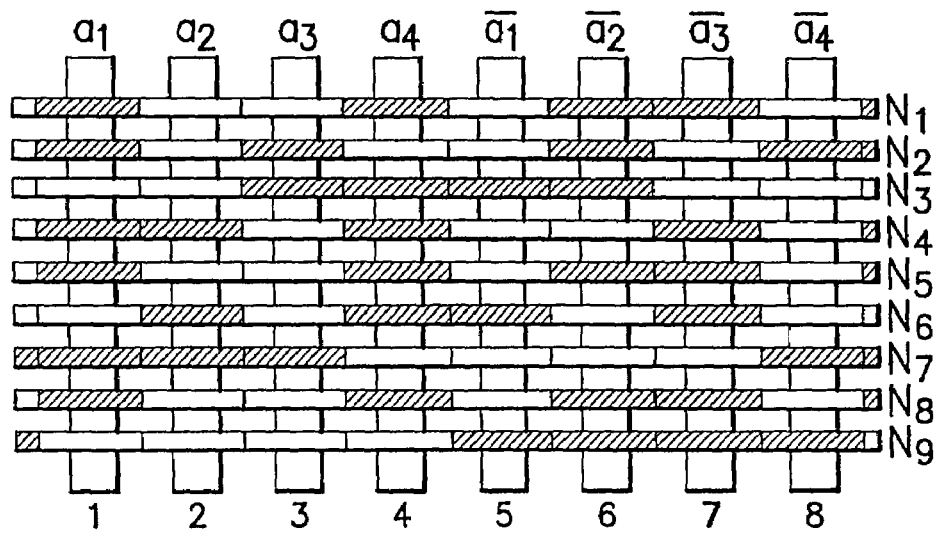
FIG. 6 shows an example of modulation-doped NWs encoded with a binary reflected code of length eight.
Figure 7:
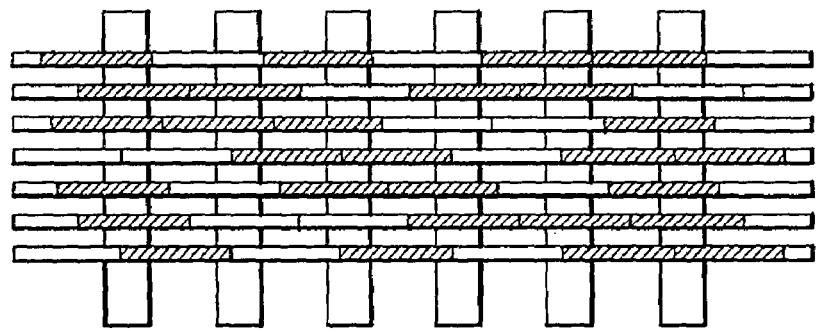
FIG. 7 illustrates an example of NWs offset by random amounts from vertical MWs.

Axial NW growth occurs when reactant activation and addition occurs at the catalyst site (e.g., the gold cluster in FIG. 5) and not on the NW surface. Radial NW growth occurs when the conditions are changed to favor homogeneous vapor phase deposition on the NW surface. Multiple shells of nearly arbitrary composition are possible, although epitaxial growth of these shells requires consideration of lattice structures.

There are a number of possible core/multi-shell nanowire heterostructures that could be prepared using atomic layer deposition and/or chemical vapor deposition methods such that the shell could be selectively etched. Two specific and non-limiting cases in which etching is carried out using 'dry' reactive-ion etching (RIE) and 'wet' chemical etching are as follows. First, a core/multi-shell nanowire heterostructure composed of silicon (Si) core, a zirconium oxide ($ZrO_2$) inner shell, and aluminum oxide ($Al_2O_3$) outer shell can be selectively etched by RIE. Using low energy argon ion ($Ar^+$) RIE (e.g., see M. E. Day, M. Delfino, S. Salimian. Low energy ion etching of aluminum oxide films and native aluminum oxide. Journal of Applied Physics, 72: 5467-5470, 1992), the $Al_2O_3$ can be selectively etched with little or no effect on $ZrO_2$ (e.g., see Yuri Lebedinskii, Andrei Zenkevich. Silicide formation at HfO2-Si and ZrO2-Si interfaces induced by Ar+ ion bombardment. Journal of Vacuum Science & Technology A, 22: 2261-2264, 2004) or the lithography polymer resist (e.g., see Y. Koval. Mechanism of etching and surface relief development of PMMA under low-energy ion bombardment. Journal of Vacuum Science & Technology B, 22: 843-851, 2004). Subsequently, the $ZrO_2$ could be selectively etched to the Si nanowire core using $BCl_3/Cl_2$ RIE for energies between 21 eV and 28 eV (e.g., see Lin Sha, Jane P. Chang. Plasma etching selectivity of $ZrO_2$ to Si in BCl3/Cl2 plasmas. Journal of Vacuum Science & Technology A, 21: 1915-1922, 2003). Second, a core/multi-shell nanowire heterostructure composed of a Si core, a $ZrO_2$ inner shell, and a germanium (Ge) outer shell may be readily prepared and etched by wet chemical methods. Specifically, Ge can be selectively etched with respect to $ZrO_2$ using a simple hydroperoxide solution (e.g., see Boris W. Batterman. Hillocks, pits, and etch rate in germanium crystals. Journal of Applied Physics, 28: 1236-1241, 1957) that only dissolves Ge but has no effect on $ZrO_2$ or the lithography polymer resist (Faraj A. Abu-Ilaiwi, Mansor B. Ahmad, Nor Azowa Ibrahim, Mohamad Zaki Ab Rahman, Khairul Zaman Md. Dahlan, Wan Md. Zin Wan. Yunus, Graft copolymerization of methyl methacrylate onto rubber-wood fiber using H2O2 and Fe2+ as an initiator system. Journal of Applied Polymer Science, 88: 2499-2503, 2003).

Reference with regard to radial NW shell growth may also be made to the above cited publication: Lincoln J. Lauhon, Mark S. Gudiksen, Deli Wang, and Charles M. Lieber, Epitaxial core-shell and core-multishell nanowire heterostructures, Nature, 420:57-61, 2002.

Assume now that core-shell NWs are produced with n shells. A core-shell, or radially encoded NW 10, is controlled with a MW 12 as follows:

a) Under the future location of the MW 12, etchants selectively remove the NW's shells, exposing its lightly-doped core.

b) Insulation is deposited over the exposed core.

c) The MW 12 is deposited over the insulation, where the NW/MW junction forms a FET.

d) A set of such junctions is referred to as a radial decoder (see FIG. 2) if, for each NW encoding, they allow only NWs with that encoding to be made conducting. Two types of radial decoders, "linear" and "logarithmic", are discussed in further detail below.

Core-shell NWs 10 have at least one important advantage: they are substantially insensitive to random lengthwise displacement, unlike modulation-doped NWs. As a consequence, core-shell NWs 10 cannot be in an ambiguous state of conduction due to misalignment of NWs 10 and MWs 12. Furthermore, when a MW 12 is deposited over exposed cores, the MW 12 will self-align with them (see Lance A. Glasser and Daniel W. Dopperpuhl, The Design and Analysis of VLSI Circuits, Addison-Wesley, Reading, Mass., 1985), thereby obtaining far superior registration between controllable NW regions and MWs than can be obtained with modulation-doped NWs.

It can be noted that with the use of core-shell NWs 10 the addition of shells increases the diameter and the spacing between NWs, thereby reducing the available area. However, additional NWs do not have to be added to account for the fact that some NWs are in an ambiguous state due to misalignment. Furthermore, NWs appear to be more tolerant of variations in the manufacturing process and are compatible with other methods of controlling NWs.

Creating a radial decoder employs a selective shell removal process, such as an etching process, that exposes the cores of NWs 10 with a particular type of radial encoding, while leaving other cores insulated. To allow for this particular selective shell removal process to occur, the shell materials must be sufficiently different that an etch for one type of shell material has little or no effect on another type of shell material.

There are a number of possible core/multi-shell nanowire heterostructures that may be prepared using atomic layer and/or chemical vapor deposition (CVD) methods such that multiple shells can be selectively etched. Four distinct exemplary and non-limiting shell materials are highlighted in FIG. 11, namely, Cu, $Al_2O_3$, GaSb, and InAs, along with specific wet etching solutions ($FeCl_3$, NaOH, $C_4H_4KNaO_6$+HCl+ $H_2O_2$+$H_2O$ and $C_6H_8O_7$+$H_2O_2$) that are capable of differentiating any of the materials from another as required to implement the decoder. Individual ones of the etchants are selected based on their ability to strongly etch one type of shell material but not strongly etch other types of shell material. For example, $C_4H_4KNaO_6$+HCl+$H_2O_2$+$H_2O$ is assumed to for this example to strongly etch GaSb, but not strongly etch InAs.

In FIG. 11 four exemplary types of shell material for the core-shell NW 10 are shown on the left. Each is assumed to include, by way of example and not as a limitation, a silicon (Si) core, a hafnium oxide shell ($HfO_2$, i.e., a high-K dielectric), and outer shells made of one of four materials. The columns list the effect of etchants on the outer shells. The etchants in the two right columns etch both InAs and GaSb. The third etchant etches GaSb 15 times faster than InAs, while the fourth etchant etches InAs 100 times faster than GaSb. Reference in this regard can be made to Oliver Dier, Chun Lin, Markus Grau, and Markus-Christian Amann, Selective and non-selective wet-chemical etchants for GaSb-based materials, Semiconductor Science and Technology, 19(11):1250-1253, 2004.

Figure 18:
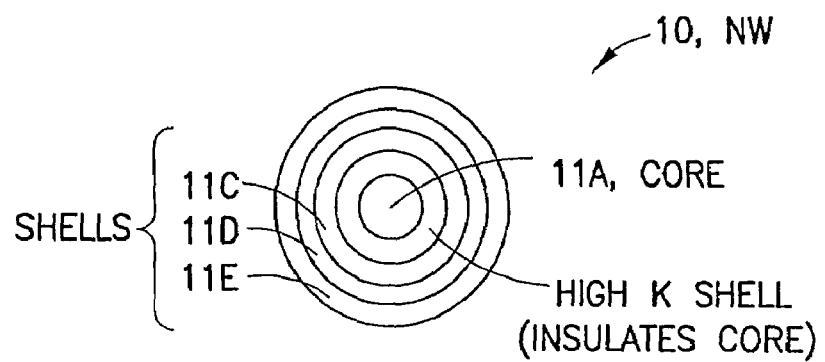
FIG. 18 is an enlarged cross-section view of a NW having a core and a plurality of shells disposed about the core.

Referring briefly to FIG. 18 there is shown an enlarged cross-section view of a NW 10 having a core 11A, a high-K dielectric shell 11B (e.g. one formed from $HfO_2$) and a plurality of shells 11C, 11D, 11E (for a non-limiting case of three shells) disposed about the core 11A and the dielectric shell 11B. A given NW 10 may have more or less than the three shells 11C, 11D, 11E shown in FIG. 18.

A specific implementation includes at least two specific features. First, the integral high dielectric constant (high-K) shell 11B of, for example, $HfO_2$ is deposited over the core 11A using, for example, CVD prior to the growth of the selectively etchable shells 11C, 11D, 11E to simplify the overall fabrication process. The high-K dielectric shell 11B increases the coupling between the NWs 10 and the controlling MWs 12. Second, the first shell 11C outside of the high-K dielectric shell 11B is made thicker than subsequent shells to ensure sufficient differential gate response of the MWs 12 in contact with the high-K dielectric on the inner shell 11B.

In the discussion of radial decoders it is assumed that each shell 11C, 11D, 11E of each NW 10 can be made from any one of a independently selectively removable (e.g., etchable) materials. Herein a notation is employed where materials are $m_1, \ldots, m_\alpha$, and Etch($m_i$, W) refers to the etching procedure that removes just material $m_i$ from the region under MW W. Writing [Etch($m_i$, W), ..., Etch($m_j$, W)] means that Etch($m_i$, W) is followed by Etch($m_{i+1}$, W), ..., Etch($m_j$, W). For an arbitrary set of materials, M, writing Etch(M, W) means that for all $m_i \in M$, all Etch($m_i$, W) are applied sequentially in some arbitrary order.

In a radial encoding the innermost shell material (11C) is listed first. In an etching sequence, operations on the outer shell (e.g., 11E, as in FIG. 18) appear first. Thus, if NWs $N_a$ and $N_b$ have radial encodings ($m_i$, $m_j$) and ($m_j$, $m_i$), respectively, the sequence [Etch($m_j$, W), Etch($m_i$, W)] exposes the core 11A of $N_a$ under MW W, but only removes the outer shell 11E of $N_b$. A MW W can then control $N_a$ without affecting $N_b$.

Described now is the linear decoder for multi-shell radial codes. In general, a radial decoder allows a set of MWs 12 to control NWs manufactured with some set of radial encodings. Consider a family F of radial encodings in which each possible encoding uses n shells, and each shell is one of $\alpha \geq 1$ possible materials. In order to ensure that shells can be removed one at a time under one MW 12, assume that two consecutive shells are not composed of the same material. When manufacturing a NW 10, the first shell can be of any of $\alpha$ types, but each additional shell must be a different type, which implies that $N=|F| \leq \alpha(\alpha-1)^{n-1}$. This means that four independently etchable materials and two shell layers can lead to 12 different shell encodings. If five independently etchable materials are used, 20 shell encodings can be generated with two shells, and 80 encodings with three shells.

Given an arbitrary family of radial encodings F, a linear decoder uses a separate MW 12 for each radial encoding. If MW $W_i$ is associated with encoding $E_i=(m_{j_1}, \ldots, m_{j_n})$, then one can apply $$[\text{Etch}(m_{j_n}, W_i), \text{Etch}(m_{j_{n-1}}, W_{m_i}), \ldots, \text{Etch}(m_{j_1}, W_i)].$$

This etching sequence exposes the cores 11A (note that the high dielectric shell 11B is still present) of NWs 10 with encoding $E_i$ under $W_i$. The cores of NWs 10 with other encodings remain unexposed, since for these NWs 10 at least one etching step will fail to remove a shell. Each of the $\lambda_R|F|$ MWs 12 can tan off exactly the NWs 10 with a particular radial encoding. The decoder shown in FIG. 2 is a linear decoder.

Note that the linear decoder etches one material in each shell under each MW 12. Thus, it performs n $\lambda_R$ etching operations, where n is the number of shells and $\lambda_R$ is the number of MWs 12 (with an equal number of masking and unmasking operations). This value can be reduced to $\lambda_R$ etching operations by observing that the etching operations under each MW 12 that remove the same material can be done together after first masking all other MWs 12 from etchants and unmasking these regions when finished.

Lemma: The linear NW decoder for $N=\alpha(\alpha-1)^{n-1}$ NW types containing n shells of $\alpha$ types can be implemented using $\lambda_R$=N MWs in N etching operations.

Discussed now is a logarithmic decoder for single-shell radial codes. A standard decoder uses $\lceil \log_2 N \rceil$ binary inputs to select one of N outputs. In order to describe a radial decoder with a logarithmic number of MWs, one may first consider the case when NWs 10 have a single shell and the family of radial encodings, F, uses $\alpha$=|F| materials. It is now shown that it is possible to control radial encoding NW type with $\lambda_R = 2\lceil \log_2 \alpha \rceil$ MWs.

To control the $\alpha$ radial encodings with $\lambda_R$ MWs 12, first associate each material with a distinct binary string of length $L \leq \lceil \log_2 \alpha \rceil$. Along each dimension of the nanoarray, a pair of MWs 12 is associated with each of the L bits. Let MWs $W_{0,i}$, $W_{1,i}$ be the two MWs associated with the ith bit. Let $M_{0,i}$ and $M_{1,i}$ be the materials having 0 and 1 as their ith bit, respectively, in their binary encodings. Apply Etch($M_{0,i}$, $W_{0,i}$) and Etch($M_{1,i}$, $W_{1,i}$). NWs with a shell made of a material in $M_{0,i}$ have their core exposed under $W_{0,i}$, while all other NWs (those in $M_{1,i}$) have their core exposed under $W_{1,i}$.

Each radial encoding is embodied as a single shell made of some material. Each material is associated with a distinct binary sequence. Each material is etched away under a distinct set of exactly L MWs. To turn off all NWs that do not have a particular radial encoding, E, it is only necessary to apply a voltage to all MWs that do not control E. Every other encoding is controlled by at least one of these MWs, hence only NWs with encoding E will remain conducting. Thus, the number of controllable NWs in each dimension of a crossbar is $\alpha$ and the number of MWs used is $\lambda_R = 2L = 2\lceil \log_2 \alpha \rceil$.

Again, note that $|M_{0,i}|(|M_{1,i}|)$ etching operations are performed under MW $W_{0,i}(W_{1,i})$. Since $|M_{0,i}|+|M_{1,i}|=\alpha$, and there are at most $\lceil \log_2 \alpha \rceil$ pairs OF MWs $W_{0,i}$ and $W_{1,i}$, the number of etching operations performed by the logarithmic method on one shell is at most $\alpha \lceil \log_2 \alpha \rceil$.

The number of operations can be reduced to a etching, masking and unmasking operations if these steps are performed under multiple MWs at the same time. To see this, observe that for each i the materials in $M_{0,i}$ and $M_{1,i}$ are etched under $W_{0,i}$ and $W_{1,i}$ in some arbitrary order. Thus, one may order the materials and etch, mask and demask NWs under MWs in parallel. In particular, an algorithm in accordance with an aspect of this invention executes three steps for each material of type t, $1 \leq t \leq \alpha$. It begins by removing masks over regions under MWs. It then applies a mask to the region under $W_{a,i}$ if $t \in M_{a,i}$, after which it etches NWs under $W_{a,i}$ if $t \in M_{a,i}$.

Lemma: The logarithmic decoder for NWs with one shell and N=$\alpha$ shell types can be implemented with $2\lceil \log_2 N \rceil$ MWs and N etching operations.

A discussion is now made of decoders for multiple-shell radial codes. In order to extend the logarithmic radial decoder to multiple shell encodings, the encodings in F are restricted. The restriction prevents every possible shell material from appearing in each shell, but allows for more powerful etching operations.

The $\alpha$=|F| shell materials are divided into two disjoint sets of size $\alpha_1$ and $\alpha_2$, $\alpha_1 + \alpha_2 = \alpha$. The materials used to form the ith shell of each radial encoding is chosen from the first set when i is odd, and from the second set when i is even. This allows for $N = \alpha_1^{\lceil n/2 \rceil} \alpha_2^{\lfloor n/2 \rfloor}$ possible encodings, which implies that $N \leq (\alpha/2)^n$ when n is even.

Let $\sigma_i$ denote the materials that can appear in the ith shell. $\sigma_i$ simply depends on the parity of i. Let M be an arbitrary set of materials. When no other etchings have been done, [Etch($\sigma_n$, W), Etch($\sigma_{n-1}$, W), ..., Etch($\sigma_{s+1}$, W)] will remove the outermost n-s shells of every NW in the region under W. Etch(M, W) then removes a shell from only NWs with a material in M in their sth shell. [Etch($\sigma_{s-1}$, W), ..., Etch($\sigma_1$, W)] then exposes the cores of these NWs. Denote this entire three-part procedure as LayerEtch(M, W, s).

The restriction on F ensures that $\sigma_i$ and $\sigma_{i+1}$ are disjoint and that Etch($\sigma_i$, W) does not remove more than one shell at a time. This implies that LayerEtch(M, W, s) can only expose the cores of NWs that are affected by the Etch(M, W) operation. LayerEtch(M, W, s) thus exposes the cores of exactly those NWs with a material in M in their sth shell.

The procedure LayerEtch(M, W, s) can be applied to any sets M of materials in the sth shell that are used by an etching procedure. In particular, it can be used with the etching procedure for the linear or logarithmic decoder on one shell. When the shell etching procedure is linear (logarithmic), the decoders resulting from these procedures may be referred to as LinearLog and FullyLog, respectively. The two decoders, which are the same when $|\sigma_i|=2$, are illustrated in FIG. 12.

Figure 12:
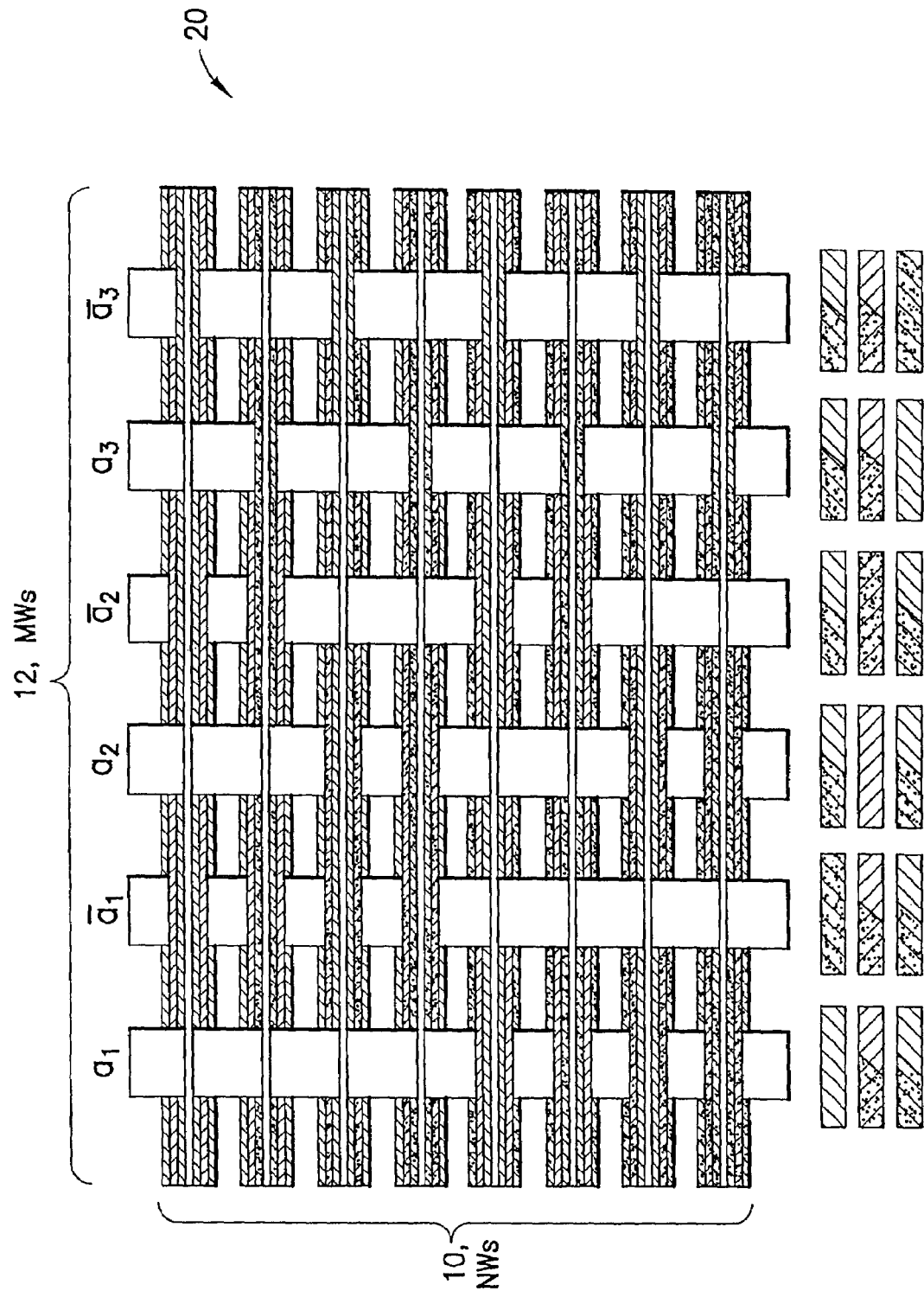
FIG. 12 illustrates a logarithmic decoder for eight (horizontal) NWs each having three shells of two types.

More specifically, reference can be made to FIG. 12 for showing a logarithmic decoder 20 for eight (horizontal) NWs 10 each having three shells of two types. The insulated core of a NW is exposed to the field on a MW 12 if the NW 10 has a particular type of material in a particular shell. Applying an immobilizing field to one of the (vertical) MWs 12 labeled $a_i$ and $\bar{a}_i$ causes one half of the NWs 10 to have very high resistance. The three shaded rectangles below MWs 12 indicates which shell material(s) is (are) removed in each shell; the top rectangle corresponds to the outer shell. If two types of shading occur in a rectangle, both materials in a shell are removed. Otherwise only one type is removed.

A discussion is now made of the FullyLog decoder. In etching for the FullyLog decoder the set M assumes values $M_{0,i}$ or $M_{1,i}$, as defined above. Thus, the FullyLog decoder uses:

$$M_{FullyLog} = \Sigma_{r=1}^{n} 2\lceil \log_2 |\sigma_r| \rceil MWs.$$

Since $$|\sigma_s| = \alpha_1$$

when s is odd, and $$|\sigma_s| = \alpha_2 \text{ when s is even,}$$

$$M_{FullyLog} = 2(\lceil n/2 \rceil \lceil \log_2 \alpha_1 \rceil + \lfloor n/2 \rfloor \lceil \log_2 \alpha_2 \rceil).$$

Consider now the number of operations that are needed to expose NWs to MWs. Let $W^s_t$ be the tth MW corresponding to the sth shell. It follows that FullyLog requires $|\sigma_r|$ etching steps under this MW in the rth shell for $r \neq s$ for a total of $T-|\sigma_s|$ operations, where $T = \Sigma_{r=1}^{n} |\sigma_r|$. There are $2\lceil \log_2 |\sigma_s| \rceil$ MWs corresponding to the sth shell and they require $|\sigma_s| \lceil \log_2 |\sigma_s| \rceil$ additional etching operations. Thus, FullyLogEtch performs $2(T-|\sigma_s|) \lceil \log_2 |\sigma_s| \rceil + |\sigma_s| \lceil \log_2 |\sigma_s| \rceil$ operations for $W^2_t$, $1 \leq t \leq |\sigma_s|$, and a total of $E_{FullyLog} = 2T\Sigma_{s=1}^{n} \lceil \log_2 |\sigma_s| \rceil - \Sigma_{s=1}^{n} |\sigma_s| \lceil \log_2 |\sigma_s| \rceil$ operations overall.

It can be seen that the FullyLog etching procedure implements NW decoders for N NW types with n shells using $O(n^2)$ etching steps. Faster algorithms can be implemented by performing operations in parallel.

As with previous decoders, the FullyLog decoder can be implemented with fewer etching steps when they are done in parallel. As suggested in FIG. 13, they can be performed in $\Sigma_{r=1}^{n} \sigma_r$ etching operations.

FIG. 13 shows the materials etched in each shell under each MW 12 for the decoder of three-shell NWs 10 shown in FIG.

12. Shell types r and g are used in the outer and inner shells and b and y are used in the inner shell. The etching procedure exposes under MW $W^s_t$ the cores of NWs that have material t in shell s. For example, under $W^2_b$ the cores of NWs are exposed that have type b in the middle shell. Etching begins with the first or outer shell. The FullyLog procedure operates on one column at a time. All but one column is exposed at a time and all cells in that column are removed in sequence. For example, under MW $W^1_r$ ($W^1_g$) it removes shells of type r (g) followed by both types of shell in successive shells. This procedure executes 36 etching steps. A fast version of the FullyLog procedure etches all cells in one row in parallel in one step except for the cell in one column that is masked. For example, it removes outer shell of type r under all MWs except for $W^1_g$. It them removes all shells of type g under all MWs except for $W^1_r$, etc. This faster procedure executes six etching steps.

Theorem: The FullyLog decoder for n-shell NWs having $\alpha_1$ ($\alpha_2$) materials in odd-(even-)indexed shells and N= $\alpha_1^{\lceil n/2 \rceil}\alpha_2^{\lfloor n/2 \rfloor}$ NW types can be implemented with $M_{FullyLog}=2(\lceil n/2 \rceil \lceil \log_2\alpha_1 \rceil + \lfloor n/2 \rfloor \lceil \log_2\alpha_2 \rceil)$ MWs, and $E=\lceil n/2 \rceil\alpha_1+\lfloor n/2 \rfloor\alpha_2$ etching operations. When $\alpha_1=\alpha_2=\alpha/2$ and n is even, $N=(\alpha/2)^n$, $M_{FullyLog}=2\lceil \log_2 N \rceil$, and $E=\log_2 N$.

A discussion is now made of the LinearLog decoder. In etching for the LinearLog decoder the set M for the sth shell assumes the value of one shell material at each MW. Thus, the LinearLog uses $M_{LinearLog}=\Sigma_{r=1}^n |\sigma_r|$ MWs. Since $|\sigma_s|=\alpha_1$ when s is odd, and $|\sigma_s|=\alpha_2$ when s is even, $M_{LinearLog}=\lceil n/2 \rceil\alpha_1+\lfloor n/2 \rfloor\alpha_2$. In some cases $M_{LinearLog}$ is smaller than $M_{FullyLog}$. For example, when $\alpha_1=\alpha_2=3$ and n=2, $M_{LinearLog}=6$ whereas $M_{FullyLog}=8$.

Consider now the number of operations that are needed to expose NWs to MWs. As with the FullyLog decoder, the LinearLog decoder under MW $W^s_t$, $1 \leq t \leq |\sigma_s|$, requires $(T-|\sigma_s|)$ operations on shells other than the s th, where $T=\Sigma_{r=1}^n |\sigma_r|$, and one operation on the s th shell for a total of $E_{LinearLog}=T^2+T-\Sigma_{r=1}^n |\sigma_s|^2$ operations. This is quadratic in n, the number of shells.

As with previous decoders, the LinearLog decoder can be implemented with $\Sigma_{r=1}^n \sigma_r$ etching operations.

Theorem: The LinearLog decoder for n-shell NWs having $\alpha_1$ ($\alpha_2$) materials in odd-(even-)indexed shells and N= $\alpha_1^{\lceil n/2 \rceil}\alpha_2^{\lfloor n/2 \rfloor}$ NW types can be implemented with:

$M_{LinearLog}=\lceil n/2 \rceil\alpha_1+\lfloor n/2 \rfloor\alpha_2$

MWs, and $E=\lceil n/2 \rceil\alpha_1+\lfloor n/2 \rfloor\alpha_2$ etching operations. When $\alpha_1=\alpha_2=\alpha/2$ and n is even, $N=(\alpha/2)^a$, $M_{LinearLog}=n \ \alpha/2$, and $E=\log_2 N$.

A discussion is now made of code discovery and faults. Recall in this regard that codewords are randomly assigned to NWs in a nanoarray. As a result a discovery process is required to determine which encodings are present. All radial decoders described above allow for the use of the efficient code discovery algorithm given in, as a non-limiting example, one found in Benjamin Gojman, Eric Rachlin, and John B. Savage, Evaluation of design strategies for stochastically assembled nanoarray memories, J. Emerg. Technol. Comput. Syst., 1(2):73-108, 2005, incorporated by reference herein.

The etching processes described above may behave imperfectly. Shells which should remain may be removed, and shells that should be removed may remain. Either error can alter the subset of active MWs that control a NW. In the nanoarray a binary tuple is assigned to each NW in which a 1 corresponds to MWs that turn NWs off, and a 0 corresponds to MWs that do not influence the NW. Etching errors can flip the bits in this tuple.

In order to protect against an occurrence of a bit flip, the tuples associated with core-shell NWs preferably have a sufficiently high Hamming distance. This may be readily accomplished with a minor modification to the single shell logarithmic etching procedure. Instead of associating arbitrary binary strings with shell materials, one may instead use coding theory to assign binary strings with a sufficiently high Hamming distance. As is explained in Philip J Kuekes, Warren Robinett, Gabriel Seroussi, and R Stanley Williams, Defect tolerant interconnect to nanoelectronic circuits, Nanotechnology, 16:869-882, 2005, NW tuples with a Hamming distance of 2d+1 can tolerate up to d errors.

When this concept is extended to the FullyLog decoder, binary tuples with a Hamming distance of 2d+1 applied to each shell allow up to nd errors to be tolerated across n shells.

A discussion is now made of two-stage etching. The unknown codewords present at each ohmic contact (OC) must be discovered and recorded in programmable address translation circuitry. If the codewords at each OC can be made the same, the size of the address translation circuitry could be dramatically reduced. The use of core-shell NWs make this possible.

More specifically, when the nanoarray is first etched, the resultant decoder can be used to discover which codewords are present at each OC. If each OC has at least C codewords, the regions under a second set of C MWs can be etched to form a second linear decoder. At each MW, at each OC, one would select an etching process that exposes one of the C shell type sequences known to be present. Each of the C MWs is then guaranteed to control at least one NW at each OC. When the new decoder is used, each OC contains each codeword, and programmable address translation circuitry is no longer needed.

Two-stage etching can create a deterministic linear decoder if C distinct shell type sequences are present at each OC. After codeword discovery, a custom etching process is used to ensure each of C MWs controls one of C NWs.

It has been discovered that an arbitrary assignment of MWs to NWs can be achieved if the C sequences present meet an additional criteria. Let S be the set of shell sequences present at a particular OC. Assume that there are C sequences in S such that each sequence contains a shell type in some shell that no other sequence in S contains in that shell. If this condition is met, C arbitrary codewords can be deterministically assigned.

Core-shell NWs eliminate misalignment and provide an elegant means of fault tolerance. Two-stage etching, though possibly more time-consuming, assigns NW codewords deterministically. This eliminates the need for programmable address translation circuitry. It also allows nanoarrays to compute functions, since each NW computes the NOR of a set of MWs.

Figure 1:
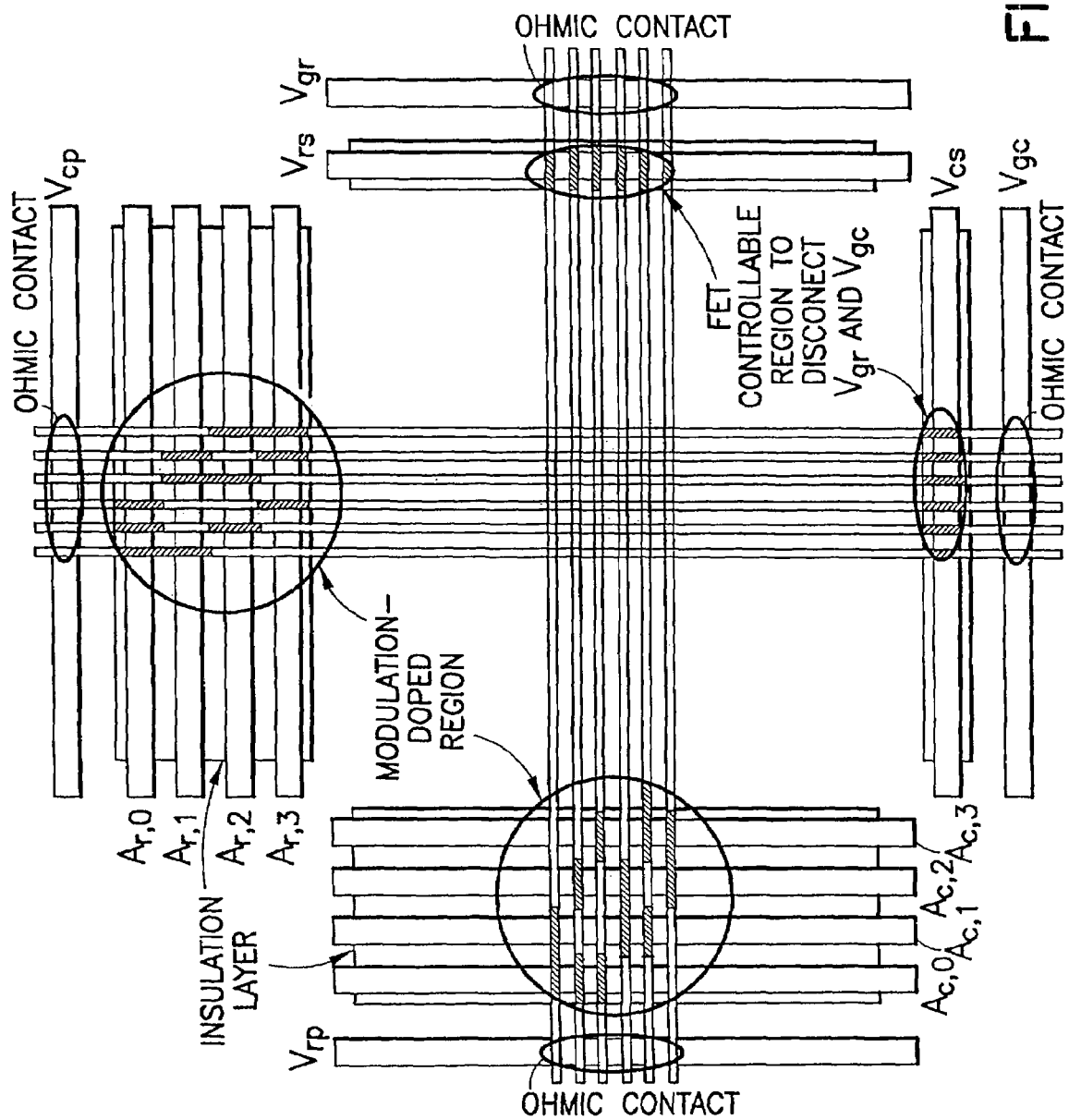
FIG. 1 shows a conventional crossbar in which NWs in each dimension are addressed by a small set of MWs.

Non-limiting examples of radial codes are now provided. Consider the number of different NW types needed to ensure that N NWs can be addressed with high probability. In FIG. 1 it is assumed that N NWs in each dimension of the crossbar are connected to one ohmic region at each end. As is shown in DeHon et al., Stochastic assembly of sublithographic nanoscale interfaces. IEEE Transactions on Nanotechnology, 2(3): 165-174, 2003, to ensure that all or most of the N NWs in each dimension are different with high probability requires that the number of differently encoded NWs, $C_R$, be enormous. Thus, assume that the ohmic region at one end of the NWs in each dimension is subdivided into m ohmic regions each containing w NWs (also shown in DeHon et al., cited above).

The diameter and pitch of radially encoded NWs grows with the number of shells. Thus, it is desirable to keep the number of shells to a reasonable minimum. In turn, the number of shells is related to $C_R$, the size of the code space. If the number of differentially etchable shell materials is small, the number of shells must be large to meet a minimum requirement on $C_R$.

One may then inquire as to how large $C_R$ must be to ensure that with probability 0.99 or larger at least half of the NWs in each dimension of an array has a unique address specified by its ohmic region and NW type within that region. Both analysis (Benjamin Gojman, Eric Rachlin, and John B. Savage, Evaluation of design strategies for stochastically assembled nanoarray memories, J. Emerg. Technol. Comput. Syst., 1(2): 73-108, 2005) and empirical evidence (Eric Rachlin and John B. Savage, Small codespace addressing strategies for nanoarrays, Nano Note 3, Computer Science Department, Brown University, 2005) indicate that it suffices to have a range of about $10 \leq C_R \leq 30$. More generally, the range may be from about $2 \leq C_R \leq X$, where x can be large. Shown in FIG. 14 are examples of radial codes that meet these requirements.

More specifically, FIG. 14 shows parameters of some radial codes with $10 \leq C_R \leq 30$. Here n is the number of shells and $\lambda_R$ is the number of MWs. The distribution of shell types is shown in the third column. The type of decoder is shown in the fourth column. The minimal number of types of shell materials that suffice to encode NWs, is shown in the sixth column (see the discussion above related to shell etching). The last column contains the diameter of NWs (and their pitch when abutted one against the other) under the assumption that cores have a diameter of about 5 nm and each shell adds about 4 nm to the diameter.

Discussed now are hybrid NW codes and decoders. A NW is considered to have a hybrid encoding if its core has an axial encoding and its shells have a radial encoding. To cope with random axial displacement of NWs, the axial encoding is repeated along the length of NWs.

It is now shown how an axial and radial decoder can be efficiently combined to form a hybrid decoder. An exemplary BRC hybrid decoder uses two sets of MWs. The first set functions as an axial decoder, the other as a radial decoder. The total number of MWs required by the hybrid decoder is proportional to the sum of the number of MWs required by the axial and radial decoders when used separately.

The BRC hybrid decoder may be designed to work exclusively with binary reflected codes. Recall that in a $\lambda_A$-BRC the doping pattern is a repeated sequence of $\lambda_A$ heavily or lightly doped regions. The repeated sequence is such that the first $\lambda_A/2$ regions are the compliment of the second $\lambda_A/2$ regions. If two regions in the sequence lie $\lambda_A/2-1$ regions apart, exactly one will be lightly doped. The radial decoding portion of the BRC hybrid decoder relies on this characteristic.

Consider a radial code controlled by a radial decoder using $\lambda_R$ MWs. Assume that the radial code is used in conjunction with a $\lambda_A$-BRC to generate hybrid NWs. A BRC hybrid decoder is constructed as follows:

a) Use $\lambda_A$ consecutive MWs for axial decoding. Under these MWs, all shells are removed from all NWs. The MWs then function as a standard axial decoder. The $\lambda_A$ MWs are used to select hybrid NWs with a given axial codeword. In other words, the MWs can make non-conducting all NWs that do not have a particular binary reflected codeword.

b) Use $2\lambda_R$ MWs for radial decoding. Each NW contains a repeated binary reflected codeword. If a pair of MWs are $\lambda_A/2-1$ regions apart, exactly one will lie over a lightly doped region. Use $\lambda_R$ such pairs (in $\lceil 2\lambda_R/\lambda_A \rceil$ repetitions of the axial code) to produce two identical radial decoders. Apply the same etching operations to both MWs in a pair.

c) One MW in each pair is adjacent to an exposed lightly doped region. If the two radial decoders are used simultaneously, they successfully simulate a standard radial decoder. The two $\lambda_R$ MWs can thus select MWs with a given radial codeword. When a radial and axial codeword are selected simultaneously, only NWs with a particular hybrid codeword will remain conducting.

As was mentioned above, $\lceil 2\lambda_R/\lambda_A \rceil$ repetitions of an axial $\lambda_A$-BRC codeword suffice to implement a radial code. Thus, $\lambda_A + \lambda_A \lceil 2\lambda_R/\lambda_A \rceil$ MWs suffice to realize a hybrid decoder. Since $\lceil 2a/b \rceil \leq (2a/b)+1$, it follows that the BRC-hybrid decoder uses at most $2(\lambda_A+\lambda_R)$ MWs. This is within a factor of two of the information theoretic minimum.

Figure 15:
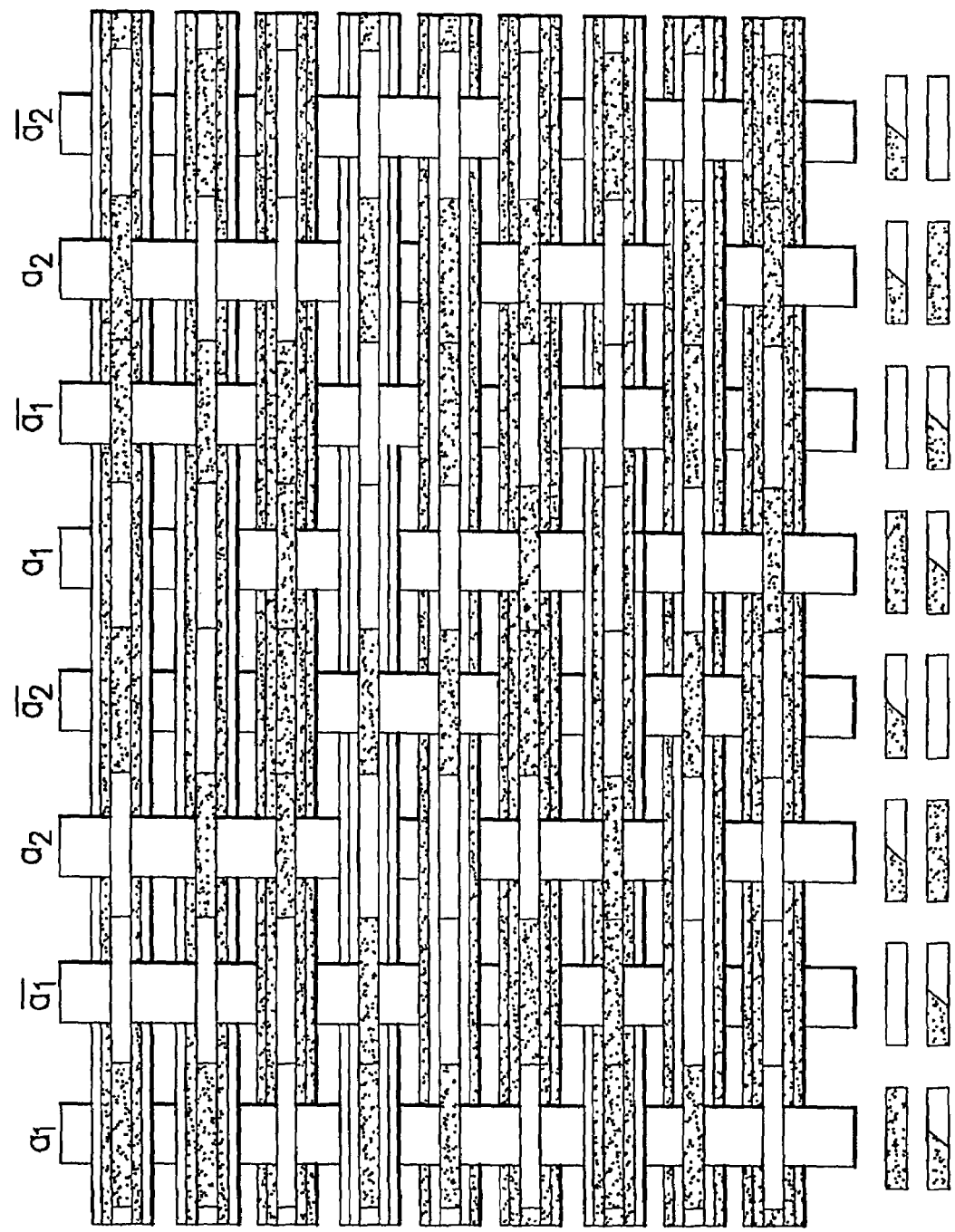
FIG. 15 illustrates a second portion of a BRC hybrid decoder devoted to radial decoding.

FIG. 15 illustrates the second portion of a BRC hybrid decoder devoted to radial decoding. An arbitrary radial decoder in which MWs are labeled $\alpha_1$, $\overline{\alpha}_1$, $\alpha_2$, and $\overline{\alpha}_2$ is implemented on the two halves of the BRC axial code.

Examples of hybrid codes are now provided. Several combinations of axial and radial encodings that produce between 12 and 32 NW types while keeping small the number of shells and shell types are shown in FIG. 16. The reason for considering this small number of NW types is explained in the discussion of examples of radial codes.

In FIG. 16 there are shown parameters of hybrid codes that produce 12 to 32 different NW types ($C_A C_R$). $C_A$ is the number of BRC axial code types and $\lambda_A$ the number of MWs it uses. The shell distribution is shown for each radial code along with its number of NW types, $C_R$, the number of shells, n, shell types $T_R$, and MWs, $\lambda_R$, that it uses with a logarithmic decoder. The total number of MWs used with the $\lambda_A$-BRC decoder is $\lambda_2 = \lambda_A(1+\lceil 2\lambda_R/\lambda_A \rceil)$. The number of codewords in the code and the diameter of NWs are also shown.

A discussion is now made of the sensitivity of the BRC hybrid decoder to displacements. Note that if a fluidic process is used to assemble NWs with hybrid codes into parallel arrays, NWs will be displaced axially or lengthwise during assembly. To cope with this problem, as mentioned above, the axial code is repeated, as was done for purely axially-coded NWs.

If a BRC is shifted axially by the pitch of MWs, the doping pattern under MWs corresponds to that of another BRC (see Gojman et al., Decoding of stochastically assembled nanoarrays. In Procs 2004 Int. Symp. on VLSL Lafayette, La., Feb. 19-20, 2004). In other words, the set of BRCs is closed under displacements by multiples of a MW pitch. The same is true of hybrid codes.

Lemma: The set of hybrid codes when decoded using by a BRC decoder is closed under axial displacements of NWs by the pitch of a MW.

The analysis of the sensitivity of axial decoders to displacements by less than a MW pitch given here is the same as that briefly mentioned above in the discussion of the misalignment of axial codes, except that the MW pitch is larger for a given number of NW encodings. Since the probability of loss of control by MWs decreases with this parameter, hybrid codes are less sensitive to axial displacements than would be a comparable axial code. It is useful to repeat here the analysis given in the above cited DeHon et al., Stochastic assembly of sublithographic nanoscale interfaces. IEEE Transactions on Nanotechnology, 2(3):165-174, 2003.

Assume that the length of a doped region is the length of the region between two MWs that cannot be controlled by either MW plus 2 $W_{overlap}$. Under this assumption NW doped regions are normal, the definition of which is given in above in the description of avoidance of on-type failures with axial codes.

As was mentioned above, the probability, $P_{control}$, that a NW is controlled by a MW is $P_{control}=(1-2\ W_{overlap}/W_{pitch})$.

A comparison is now made of various NW encoding strategies.

Radial, axial and hybrid codes can be compared along various dimensions. Some of these are: a) the total area of a chip including the area of the crossbar as well as the area of a memory to translate external to internal addresses, b) the area of the crossbar alone under the assumption that the area of the translation memory can be ignored, c) the difficulty of manufacturing NWs with a given type of encoding, and d) the difficulty reliably assembling a memory. In light of uncertainties that exist with respect to these issues, one may compare NW encodings on the basis of the second measure, namely, the area of the crossbar alone. This is done by comparing the effective pitch of the NWs.

The effective pitch of NWs is their actual pitch increased by a factor that takes into account the loss of NWs due to duplication and/or misalignment. Note that misalignment is possible with both axial and hybrid codes.

It is preferred to compare only the effective pitch of radial and axial codes because the hybrid codes are generally inferior to axial codes. Hybrid codes incur almost the same misalignment penalty as axial codes but have increased pitch. Thus, in this comparison they are considered to be inferior to both radial and axial codes. However, hybrid codes may still be useful since a removable shell is always added to axially coded NWs to ensure that they remain separated during fluidic assembly, and this added shell may then be used to advantage.

To compare the effective pitch of NWs with axial and radial coding one may compute their raw diameter (see FIG. 17), which is also their raw pitch, under the assumption that each axially coded NW has one shell, as indicated above, and that the assembly process abuts one NW with another.

More particularly, FIG. 17 presents a comparison of axial and radial codes in terms of their effective NW pitch for four different values of C, the code size, for radial codes having s=2 or 3 shells and μ=4 or 5 different types of shell material. When decoded with a linear decoder, the radial codes have $C_R$=12, 20, 24 or 80 code types. The number of NWs with different addresses that occur with probability 0.99 among 1,000 NWs connected to 100 contact groups is shown. The value of $P_{control}=(1-2\ W_{overlap}/W_{pitch})$ is computed when $W_{pitch}$=105 or 50 nm and $W_{overlap}$=5 or 10 nm, that is, when $P_{control}$=0.91, 0.81, 0.80 or 0.60. Results when $P_{control}$=0.81 are not shown.

Radially coded NWs will generally have more than one shell. One may then ask how many individually addressable NWs remain, after ignoring duplicates and misaligned NWs, when the NWs are organized into 100 contact groups (also known as "ohmic regions") each of which contains 10 NWs. A Monte Carlo simulation was performed with four code sizes, namely, C=12, 20, 24 and 80, to determine how many addressable NWs are accessible among the 1,000 NWs in the 100 contact groups. These code sizes are those that are realizable with either two or three shells containing either four or five different types of material on radially coded NWs when linearly decoded (see FIG. 14) The simulations were performed under the assumption that either no misalignment occurs, or that it occurs with probabilities 0.09, 0.20 and 0.40.

The three values where chosen because they are three of the values of 1-$P_{control}$ that arise when $W_{pitch}$=105 or 50 nm and $W_{overlap}$=5 or 10 nm. The fourth case in which $P_{control}$=0.81 is ignored in FIG. 17 as it does not provide new information.

As these data indicate, radial codes have a slight disadvantage with regard to effective NW pitch. However, it appears that axial encodings are more difficult to prepare because of variation in the length of doped regions and the difficulty of producing abrupt transitions between differently doped regions. Also, axially doped NWs can be in an ambiguous conducting state. Finally, and because axially encoded NWs will require at least one shell to keep them separate under fluidic assembly, it can be advantageous to consider radially encoded NWs, especially if the number of differentially etchable shell materials can be increased beyond five.

Based on the foregoing discussion, it should be appreciated that radially encoded NWs provide an attractive method to differentiate NWs, such as when they are assembled into crossbars. The need for an effective method of differentiating NWs was made apparent in the discussion of the problems that arise with axially encoded NWs as a result of their random misalignment during the fluidic assembly of crossbars.

As a confirmation of the feasibility of radially encoded NWs, several examples of materials that are differentially etchable were provided, as were suitable etchants. Also discussed in detail were methods for decoding radially encoded NWs: the linear and logarithmic methods on one shell, and the LinearLog and FullyLog on multiple shells. It was demonstrated that a large number of NW types, $C_R$, can be created from a small number of shell materials, especially when decoded through the use of the linear method.

Algorithms were considered, for the various decoder types, for etching NWs to expose their insulated, lightly-doped cores to the fields applied by MWs. For each of these algorithms the number of etching steps was shown could be reduced to the sum of the number of material types in each shell, when etching is done in parallel.

A consideration was also given to NW encodings that are a hybrid of axial and radial encodings.

Finally, a representative comparison was performed of the effective NW pitch for axial and radial encodings. This comparison suggests that axial codes may be at least slightly superior to radial codes, as measured by their effective pitch. However, given that axial codes require a more delicate manufacturing process, and that shells are useful for other purposes, it is apparent that radial codes in accordance with exemplary embodiments of this invention can function as an important type of NW encoding in the realization of devices, such as those that employ nanoarray crossbars.

Figure 19:
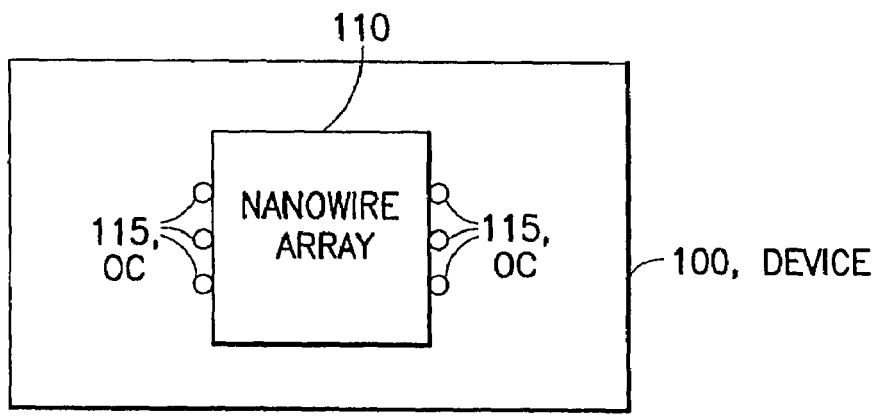
FIG. 19 illustrates a device that contains a nanowire array that is constructed in accordance with the invention.

FIG. 19 illustrates a device 100 that contains a radially encoded nanowire array 110 that is constructed in accordance with the exemplary embodiments of this invention. The device 100 may be, or it may contain, a digital data storage memory and/or a PLA as two exemplary and non-limiting embodiments. Other circuitry may be contained in the device 100, for example a digital data processor (not shown) that operates in conjunction with a memory that is constructed using the radially encoded nanowire array 110. Electrical connections to the nanowire array 110 are made via ohmic contacts (OCs) 115 that are electrically coupled to the various MWs 12, that in turn selectively turn off and on the radially encoded NWs 10, as has been explained in detail above.

Figure 20:
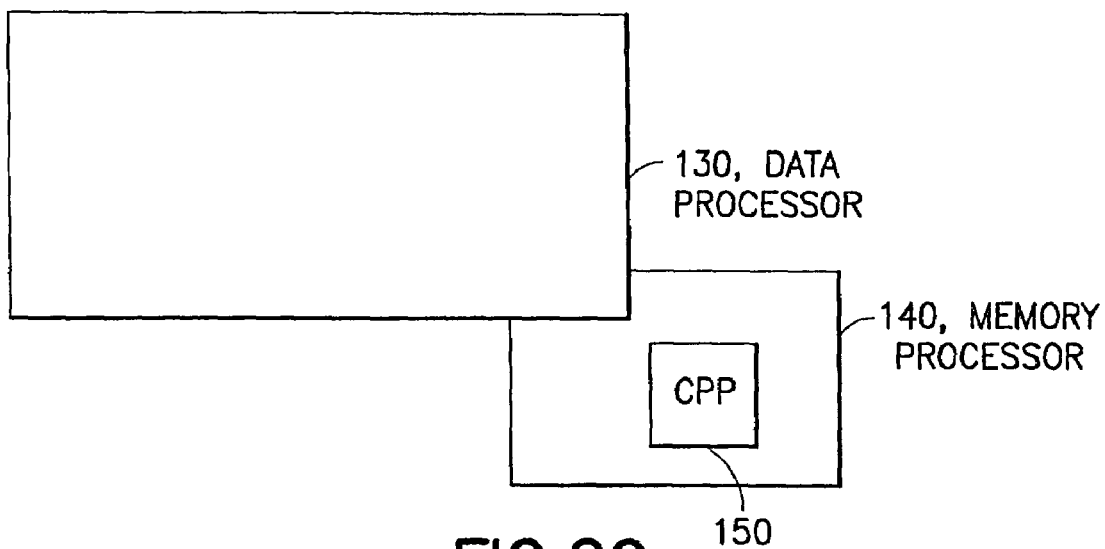
FIG. 20 shows a data processor capable of executing a computer program product that is useful in fabricating the radially encoded nanowire array in accordance with the exemplary embodiments of this invention.

FIG. 20 shows a data processor 130 that contains or is coupled to a memory 140 that stores a computer program product (CPP) 150. The execution of the CPP 150 by the data processor 130 is useful in fabricating the radially encoded nanowire array 110 in accordance with the exemplary embodiments of this invention. For example, the execution of the CPP 150 may be useful in assigning different shell materials to different shells and/or for planning and possibly controlling the selective shell material removal sequences discussed above for fabricating different ones of the decoders.

In general, some aspects of the various embodiments considered above may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Various modifications and adaptations may become apparent to those skilled in the relevant arts in view of the foregoing description, when read in conjunction with the accompanying drawings. However, any and all modifications of the teachings of this invention will still fall within the scope of the non-limiting embodiments of this invention.

As one example, it is within the scope of the exemplary embodiments of this invention to use at least one type of organic material as a shell material, either alone or in combination with one or more inorganic shell materials, such as those discussed above. In this case the selective shell removal process is one that is selected for preferentially removing the organic material. The use of optically-based polymerization/depolymerization processes are within the scope of the exemplary embodiments of this invention. It is also within the scope of the exemplary embodiments of this invention to use a wavelength selective chromophore in conjunction with a shell material to enable the selective removal process to be carried out using light having a chromophore-specific wavelength. As an example, a laser may used to selectively remove or ablate certain shell material(s) and not others. Depending on the focal spot size of the laser some number of NWs may be simultaneously treated in this manner.

In a still further non-limiting example a NW may be coated by simple absorption by water soluble polyelectrolyte such as polylysine. Then, in a masked structure, polylysine may be selectively removed using a neutral pH aqueous process that would not affect other shell materials, such as oxide-based shell materials. This approach is compatible with existing photoresists, such as PMMA, that may be used to define regions wherein the selective shell removal process is desired to be carried out since PMMA is removed in an organic solvent that will not remove polylysine.

It should be appreciated that the selective removal of shell material from a NW can be carried out by any of a number of suitable techniques including, but not limited to, the use of wet or dry etching, the use of a solvent and the use of electromagnetic energy. These various shell material removal processes may be collectively referred to for convenience as "etching".

It should be appreciated that some shell materials may be best employed in conjunction with a dielectric material. For example, electrically conductive shell materials, such as Cu, when exposed may be coated with a suitable electrically insulating dielectric material, such as an oxide or a polymer as two non-limiting examples.

It should be further appreciated that an array of nanowires constructed as described may be employed as a detector of molecules, such as biological molecules, by providing one or more molecule-specific receptors on one or more sets of NWs, where the presence of a specific molecule when bound to its' receptor results in a detectable change in NW electrical properties.

It should be further appreciated that as employed herein an "array" of nanowires may be a one dimensional array, where the NWs run essentially in parallel to one another between ohmic contacts, or a two or three dimensional array, where two or more one dimensional arrays are arranged orthogonally (or with some other angular relationship) one to another.

It should be noted that some of the features of the various non-limiting embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method to construct a device comprised of a plurality of nanowires (NWs) each comprised of a core and at least one shell, comprising:
    providing a plurality of radially encoded NWs where each shell is comprised of one of a plurality of different shell materials; and
    differentiating individual ones of the NWs from one another by selectively removing or not removing shell material within areas to be electrically coupled to individual ones of a plurality of mesowires (MWs), where
    selectively removing or not removing comprises applying an etching process to the NWs using a plurality of sequentially applied etchants, where individual ones of the etchants are selected based on their ability to strongly etch one type of shell material but not strongly etch other types of shell material.

2. A method as in claim 1, where selectively removing or not removing comprises etching the NWs within predetermined areas, and further comprising forming the MWs within the predetermined areas.

3. A method as in claim 1, where each core is surrounded by an insulating shell comprised of a dielectric material, the insulating shell being disposed between the core and at least one shell.

4. A method as in claim 1, where said shell materials comprise two or more of Cu, $Al_2O_3$, GaSb and InAs, and where said etchants comprise two or more of $FeCl_3$, NaOH, $C_4H_4KNaO_6+HCl+H_2O_2+H_2O$ and $C_6H_8O_7+H_2O_2$.

5. A method as in claim 1, where two adjacent shells are comprised of two different shell materials.

6. A method as in claim 1, where each core is axially doped.

7. A method as in claim 1, where a linear NW decoder for $N=\alpha(\alpha-1)^{n-1}$ NW types containing n shells of $\alpha$ types of shell materials is implemented with $\lambda_R = N$ MWs in N etching operations.

8. A method as in claim 1, where $\alpha = |F|$ shell materials are divided into two disjoint sets of size $\alpha_1$ and $\alpha_2$, $\alpha_1+\alpha_2=\alpha$, where the shell materials used to form the ith shell of each radial encoding is chosen from the first set when i is odd, and from the second set when i is even enabling $N=\alpha_1^{\lceil n/2 \rceil}\alpha_2^{\lfloor n/2 \rfloor}$ possible NW radial encodings.

9. A method as in claim 8, where $\sigma_i$ denotes those shell materials that can appear in the ith shell, where $\sigma_i$ depends on the parity of i, where M is an arbitrary set of shell materials, where W represents a particular MW, and where, when no previous etching has been performed, [Etch($\sigma_n$, W), Etch($\sigma_{n-1}$, W), . . . , Etch($\sigma_{s+1}$, W)] removes the outermost n–s shells of every NW in a region under W, Etch(M, W) removes a shell from only NWs with a material in M in their sth shell, and [Etch($\sigma_{s-1}$, W), ..., Etch($\sigma_1$, W)] exposes the cores of the NWs.

10. A method as in claim 1, where a FullyLog decoder for n-shell NWs having $\alpha_1$ ($\alpha_2$) materials in odd-(even-)indexed shells and N=$\alpha_1^{\lceil n/2 \rceil}\alpha_2^{\lceil n/2 \rceil}$ NW types is implemented with $M_{FullyLog}$=2($\lceil n/2 \rceil \lceil \log_2\alpha_1 \rceil + \lfloor n/2 \rfloor \lceil \log_2\alpha_2 \rceil$) MWs, and E=$\lceil n/2 \rceil\alpha_1 + \lfloor n/2 \rfloor\alpha_2$ etching operations, where when $\alpha_1=\alpha_2=\alpha/2$ and n is even, N=$(\alpha/2)^n$, $M_{FullyLog}$=2$\lceil \log_2 N \rceil$, and E=$\log_2 N$.

11. A method as in claim 1, where a LinearLog decoder for n-shell NWs having $\alpha_1$ ($\alpha_2$) materials in odd-(even-)indexed shells and N=$\alpha_1^{\lceil n/2 \rceil}\alpha_2^{\lfloor n/2 \rfloor}$ NW types is implemented with $M_{LinearLog}$=$\lceil n/2 \rceil\alpha_1 + \lfloor n/2 \rfloor\alpha_2$ MWs, and E=$\lceil n/2 \rceil\alpha_1 + \lfloor n/2 \rfloor\alpha_2$ etching operations, where when $\alpha_1=\alpha_2=\alpha/2$ and n is even, N=$(\alpha/2)^n$, $M_{linearLog}$=n $\alpha/2$, and E=$\log_2 N$.

12. A method as in claim 1, where the etching process is a two-stage etching process, where when a nanoarray that comprises the plurality of NWs is first etched, a resultant first decoder is used to discover which codewords are present at each ohmic contact (OC), and where if each OC has at least C codewords, regions under a second set of C MWs are etched to form a second decoder.

13. A method as in claim 12, where at each MW, at each OC, further comprising selecting an etching process that exposes one of C shell material type sequences known to be present such that each of C MWs controls at least one particular NW at each OC.

14. A method as in claim 12, where S is a set of shell material sequences present at a particular OC, where there are C sequences in S such that each sequence contains a shell material type in some shell that no other sequence in S contains in that shell, and when this condition is met, C arbitrary codewords are deterministically assignable.

15. A method as in claim 1, where a size of a NW array codespace $C_R$ is in a range of about $2 \leq C_R \leq x$.

16. A method as in claim 1, where a size of a NW array codespace $C_R$ is in a range of about $10 \leq C_R \leq 30$.

17. A method as in claim 1, where the device comprises a digital data storage memory.

18. A method as in claim 1, where the device comprises a programmable logic array.

19. A method as in claim 1, where the shell material is comprised of a non-organic material.

20. A method as in claim 1, where the shell material is comprised of an organic material.

21. A method to construct a device comprised of a plurality of nanowires (NWs) each comprised of a core and at least one shell, comprising:
  providing a plurality of radially encoded NWs where each shell is comprised of one of a plurality of different shell materials; and
  differentiating individual ones of the NWs from one another by selectively removing or not removing shell material within areas to be electrically coupled to individual ones of a plurality of mesowires (MWs), where
  selectively removing or not removing comprises applying an etching process to the NWs, where
  a logarithmic NW decoder for NWs with one shell and N=$\alpha$ types of shell material is implemented with 2$\lceil \log_2 N \rceil$ MWs and N etching operations.

22. A method to construct a device comprised of a plurality of nanowires (NWs) each comprised of a core and at least one shell, comprising:
  providing a plurality of radially encoded NWs where each shell is comprised of one of a plurality of different shell materials; and
  differentiating individual ones of the NWs from one another by selectively removing or not removing shell material within areas to be electrically coupled to individual ones of a plurality of mesowires (MWs), where
  at least some of the plurality of NWs exhibit a hybrid encoding where the core is axially encoded and a plurality of shells are radially encoded.

23. A method as in claim 22, where a radial NW code is controlled by a radial decoder that uses $\lambda_R$ MWs and is used in conjunction with a $\lambda_A$-BRC (binary reflected code), and where a hybrid decoder is constructed by steps comprising:
  a) using $\lambda_A$ consecutive MWs for axial decoding, where under these MWs all shells are removed from all NWs such that these MWs function as an axial decoder, where the $\lambda_A$ consecutive MWs are used to select hybrid NWs with a given axial encoding by making non-conducting all NWs that do not exhibit a particular binary reflected codeword;
  b) using 2$\lambda_R$ MWs for radial decoding, where each NW contains a repeated binary reflected codeword such that if a pair of MWs are $\lambda_A/2-1$ regions apart, exactly one lies over a lightly doped core region, and using $\lambda_R$ such pairs in $\lceil 2\lambda_R/\lambda_A \rceil$ repetitions of the axial code to produce two identical radial decoders and applying same etching operations to both MWs in a pair; and
  c) where one MW in each pair is adjacent to an exposed lightly doped core region, using the two radial decoders simultaneously to simulate a radial decoder, where the two $\lambda_R$ MWs select MWs with a given radial codeword, and where when a radial codeword and an axial codeword are selected simultaneously, only NWs with a particular hybrid codeword remain conducting.

24. An array comprised of a plurality of nanowires (NWs) each comprised of a core and at least one shell, where the plurality of NWs comprise radially encoded NWs where each shell is comprised of one of a plurality of different shell materials for differentiating individual ones of the radially encoded NWs from one another by having shells that are selectively removed within areas electrically coupled to individual ones of a plurality of mesowires (MWs) where
  shells are selectively removed by an etching process prior to formation of the MWs, the etching process using a plurality of sequentially applied etchants, where individual ones of the etchants are selected based on their ability to strongly etch one type of shell material but not strongly etch other types of shell material.

25. An array as in claim 24, where each core is surrounded by an insulating shell comprised of a dielectric material, the insulating shell being disposed between the core and the at least one shell.

26. An array as in claim 24, where said shell materials comprise two or more of Cu, $Al_2O_3$, GaSb and InAs, and where said etchants comprise two or more of $FeCl_3$, NaOH, $C_4H_4KNaO_6$+HCl+$H_2O_2$+$H_2O$ and $C_6H_8O_7$+$H_2O_2$.

27. An array as in claim 24, where two adjacent shells are comprised of two different shell materials.

28. An array as in claim 24, where each core is axially doped.

29. An array as in claim 24, further comprising a linear NW decoder for N=$\alpha(\alpha-1)^{n-1}$ NW types containing n shells of a types of shell materials implemented with $\lambda_R$=N MWs in N etching operations.

30. An array as in claim 24, further comprising a logarithmic NW decoder for NWs with one shell and N=a types of shell material implemented with $2\lceil \log_2 N\rceil$ NWs and N etching operations.

31. An array as in claim 24, where $\alpha=|F|$ shell materials are divided into two disjoint sets of size $\alpha_1$ and $\alpha_2$, $\alpha_1+\alpha_2=\alpha$, where the shell materials used to form the ith shell of each radial encoding is chosen from the first set when i is odd, and from the second set when i is even enabling $N=\alpha_1^{\lceil n/2\rceil}\alpha_2^{\lfloor n/2\rfloor}$ possible NW radial encodings.

32. An array as in claim 31, where $\sigma_i$ denotes those shell materials that can appear in the ith shell, where $\sigma_i$ depends on the parity of i, where M is an arbitrary set of shell materials, where W represents a particular MW, and where, when no previous etching has been performed, [Etch($\sigma_n$, W), Etch($\sigma_{n-1}$, W), ..., Etch($\sigma_{s+1}$, W)] removes the outermost n−s shells of every NW in a region under W, Etch(M, W) removes a shell from only NWs with a material in M in their sth shell, and [Etch($\sigma_{s-1}$, W), ..., Etch($\sigma_1$, W)] exposes the cores of the NWs.

33. An array as in claim 24, further comprising a FullyLog decoder for n-shell NWs having $\alpha_1$ ($\alpha_2$) materials in odd-(even-)indexed shells and $N=\alpha_1^{\lceil n/2\rceil}\alpha_2^{\lfloor n/2\rfloor}$ NW types is implemented with $M_{FullyLog}=2(\lceil n/2\rceil\lceil \log_2\alpha_1\rceil+\lfloor n/2\rfloor\lceil \log_2\alpha_2\rceil)$ MWs, and $E=\lceil n/2\rceil\alpha_1+\lfloor n/2\rfloor\alpha_2$ etching operations, where when $\alpha_1=\alpha_2=\alpha/2$ and n is even, $N=(\alpha/2)^n$, $M_{FullyLog}=2\lceil \log_2 N\rceil$, and $E=\log_2 N$.

34. An array as in claim 24, further comprising a LinearLog decoder for n-shell NWs having $\alpha_1$ ($\alpha_2$) materials in odd-(even-)indexed shells and $N=\alpha_1^{\lceil n/2\rceil}\alpha_2^{\lfloor n/2\rfloor}$ NW types is implemented with $M_{LinearLog}=\alpha_1^{\lceil n/2\rceil}\alpha_2^{\lfloor n/2\rfloor}$ MWs, and $E=\lceil n/2\rceil\alpha_1+\lfloor n/2\rfloor\alpha_2$ etching operations, where when $\alpha_1=\alpha_2=a/2$ and n is even, $N=(\alpha/2)^n$, $M_{LinearLog}=n\,\alpha/2$, and $E=\log_2 N$.

35. An array as in claim 24, where the etching process is a two-stage etching process, where when the array is first etched, a resultant first decoder is used to discover which codewords are present at each ohmic contact (OC), and where if each OC has at least C codewords, regions under a second set of C MWs are etched to form a second decoder.

36. An array as in claim 35, where at each MW, at each OC, the two-stage etching process is conducted using an etching process that exposes one of C shell material type sequences known to be present such that each of C MWs controls at least one particular NW at each OC.

37. An array as in claim 35, where S is a set of shell material sequences present at a particular OC, where there are C sequences in S such that each sequence contains a shell material type in some shell that no other sequence in S contains in that shell, and when this condition is met, C arbitrary codewords are deterministically assignable.

38. An array as in claim 24, where at least some of the plurality of NWs exhibit a hybrid encoding where the core is axially encoded and a plurality of shells are radially encoded.

39. An array as in claim 38, comprising a radial decoder that controls a radial NW code using $\lambda_R$ MWs used in conjunction with a $\lambda_A$-BRC (binary reflected code), further comprising a hybrid decoder.

40. An array as in claim 38, where said hybrid decoder is constructed by a) using $\lambda_A$ consecutive MWs for axial decoding, where under these MWs all shells are removed from all NWs such that these MWs function as an axial decoder, where the $\lambda_A$ consecutive MWs are used to select hybrid NWs with a given axial encoding by making non-conducting all NWs that do not exhibit a particular binary reflected codeword;

b) using two $\lambda_R$ MWs for radial decoding, where each NW contains a repeated binary reflected codeword such that if a pair of MWs are $\lambda_A/2-1$ regions apart, exactly one lies over a lightly doped core region, and using $\lambda_R$ such pairs in $\lceil 2\lambda_R/\lambda_A\rceil$ repetitions of the axial code to produce two identical radial decoders and applying same etching operations to both MWs in a pair; and c) where one MW in each pair is adjacent to an exposed lightly doped core region, using the two radial decoders simultaneously to simulate a radial decoder, where the two $\lambda_R$ MWs select MWs with a given radial codeword, and where when a radial codeword and an axial codeword are selected simultaneously, only NWs with a particular hybrid codeword remain conducting.

41. An array as in claim 24, comprising part of a digital data storage memory.

42. An array as in claim 24, comprising part of a programmable logic array.

43. An array as in claim 24, where the shell material is comprised of a non-organic material.

44. An array as in claim 24, where the shell material is comprised of an organic material.

45. An array comprised of a plurality of nanowires (NWs) each comprised of a core and at least one shell, where the plurality of NWs comprise radially encoded NWs where each shell is comprised of one of a plurality of different shell materials for differentiating individual ones of the radially encoded NWs from one another by having shells that are selectively removed within areas electrically coupled to individual ones of a plurality of mesowires (MWs), where a size of a codespace $C_R$ is in a range of about $2\leq C_R\leq x$.

46. An array as in claim 45, where the size of the codespace $C_R$ is in a range of about $10\leq C_R\leq 30$.

47. A computer program product embodied on a non-transitory computer readable medium and comprising program instructions the execution of which results in operations of differentiating individual ones of a plurality of radially encoded NWs from one another by determining a sequence of operations to remove or not remove NW shell material within areas to be electrically coupled to individual ones of a plurality of mesowires (MWs), the operations using a plurality of sequentially applied shell material removal agents, where individual ones of the agents are selected based on their ability to strongly remove one type of shell material but not strongly remove other types of shell material, where a size of a NW array codespace $C_R$ is in a range of about $2<C_R<x$.

48. A computer program product as in claim 47, where a linear NW decoder for $N=\alpha(\alpha-1)^{n-1}$ NW types containing n shells of a types of shell materials is implemented with $\lambda_R=N$ MWs in N shell material removal operations.

49. A computer program product as in claim 47, where a logarithmic NW decoder for NWs with one shell and N=a types of shell material is implemented with $2\lceil \log_2 N\rceil$ MWs and N shell material removal operations.

50. A computer program product as in claim 47, further comprising program instructions the execution of which divides $\alpha=|F|$ shell materials into two disjoint sets of size $\alpha_1$ and $\alpha_2$, $\alpha_1+\alpha_2=\alpha$, where the shell materials used to form the ith shell of each radial encoding is chosen from the first set when i is odd, and from the second set when i is even enabling $N=\alpha_1^{\lceil n/2\rceil}\alpha_2^{\lfloor n/2\rfloor}$ possible NW radial encodings.

51. A computer program product as in claim 50, where $\sigma_i$ denotes those shell materials that can appear in the ith shell, where $\sigma_i$ depends on the parity of i, where M is an arbitrary set of shell materials, where W represents a particular MW, and where, when no previous shell material removal operation has been performed, a shell material removal process [Etch($\sigma_n$, W), Etch($\sigma_{n-1}$, W), ..., Etch($\sigma_{s+1}$, W)] removes the outermost n−s shells of every NW in a region under W, Etch(M, W)

removes a shell from only NWs with a material in M in their sth shell, and $[Etch(\sigma_{s-1}, W), \ldots, Etch(\sigma_1, W)]$ exposes the cores of the NWs.

52. A computer program product as in claim 47, where a FullyLog decoder for n-shell NWs having $\alpha_1$ ($\alpha_2$) materials in odd-(even-)indexed shells and $N=\alpha_1^{\lceil n/2 \rceil}\alpha_2^{\lfloor n/2 \rfloor}$ NW types is implemented with $M_{FullyLog}=2(\lceil n/2 \rceil \lceil \log_2\alpha_1 \rceil+\lceil n/2 \rceil \lceil \log_2\alpha_2 \rceil)$ MWs, and $E=\lceil n/2 \rceil\alpha_1+\lfloor n/2 \rfloor\alpha_2$ shell material removal operations, where when $\alpha_1=\alpha_2=\alpha/2$ and n is even, $N=(\alpha/2)^n$, $M_{FullyLog}=2\lceil \log_2 N \rceil$, and $E=\log_2 N$.

53. A computer program product as in claim 47, where a LinearLog decoder for n-shell NWs having $\alpha_1$ ($\alpha_2$) materials in odd-(even-)indexed shells and $N=\alpha_1^{\lceil n/2 \rceil}\alpha_2^{\lfloor n/2 \rfloor}$ NW types is implemented with $M_{LinearLog}=\lceil n/2 \rceil\alpha_1+\lfloor n/2 \rfloor\alpha_2$ MWs, and $E=\lceil n/2 \rceil\alpha_1+\lfloor n/2 \rfloor\alpha_2$ shell material removal operations, where when $\alpha_1=\alpha_2=\alpha/2$ and n is even, $N=(\alpha/2)^n$, $M_{LinearLog}=n\alpha/2$, and $E=\log_2 N$.

54. A computer program product as in claim 47, where the shell material removal process is a two-stage process, where when a nanoarray that comprises the plurality of NWs is first processed to selectively remove shell material, a resultant first decoder is used to discover which codewords are present at each ohmic contact (OC), and where if each OC has at least C codewords, regions under a second set of C MWs are processed to form a second decoder.

55. A computer program product as in claim 54, where at each MW, at each OC, further comprising selecting a shell material removal process that exposes one of C shell material type sequences known to be present such that each of C MWs controls at least one particular NW at each OC.

56. A computer program product as in claim 54, where S is a set of shell material sequences present at a particular OC, where there are C sequences in S such that each sequence contains a shell material type in some shell that no other sequence in S contains in that shell, and when this condition is met, C arbitrary codewords are deterministically assignable.

57. A computer program product as in claim 47, execution of which results in at least some of the plurality of NWs exhibit a hybrid encoding where the core is axially encoded and a plurality of shells are radially encoded.

58. A computer program product as in claim 57, where a radial NW code is controlled by a radial decoder that uses $\lambda_R$ MWs and is used in conjunction with a $\lambda_A$-BRC (binary reflected code), and where a hybrid decoder is constructed by operations that comprise:

a) using $\lambda_A$ consecutive MWs for axial decoding, where under these MWs all shells are removed from all NWs such that these MWs function as an axial decoder, where the $\lambda_A$ consecutive MWs are used to select hybrid NWs with a given axial encoding by making non-conducting all NWs that do not exhibit a particular binary reflected codeword;

b) using $2\lambda_R$ MWs for radial decoding, where each NW contains a repeated binary reflected codeword such that if a pair of MWs are $\lambda_A/2-1$ regions apart, exactly one lies over a lightly doped core region, and using $\lambda_R$ such pairs in $\lceil 2\lambda_R/\lambda_A \rceil$ repetitions of the axial code to produce two identical radial decoders and applying the same shell material removal operations to both MWs in a pair; and c) where one MW in each pair is adjacent to an exposed lightly doped core region, using the two radial decoders simultaneously to simulate a radial decoder, where the two $\lambda_R$ MWs select MWs with a given radial codeword, and where when a radial codeword and an axial codeword are selected simultaneously, only NWs with a particular hybrid codeword remain conducting.

59. A computer program product as in claim 47, used in the fabrication of a digital data storage memory.

60. A computer program product as in claim 47, used in the fabrication of a programmable logic array.

61. A computer program product as in claim 47, where the shell material is comprised of a non-organic material.

62. A computer program product as in claim 47, where the shell material is comprised of an organic material.

\* \* \* \* \*